US009880200B2

(12) United States Patent
Faifer et al.

(10) Patent No.: US 9,880,200 B2
(45) Date of Patent: Jan. 30, 2018

(54) METHOD AND APPARATUS FOR NON-CONTACT MEASUREMENT OF FORWARD VOLTAGE, SATURATION CURRENT DENSITY, IDEALITY FACTOR AND I-V CURVES IN P-N JUNCTIONS

(71) Applicant: KLA-Tencor Corporation, Milpitas, CA (US)

(72) Inventors: Vladimir N. Faifer, Santa Clara, CA (US); Ian Sierra Gabriel Kelly-Morgan, San Francisco, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/475,025

(22) Filed: Sep. 2, 2014

(65) Prior Publication Data

US 2015/0061715 A1    Mar. 5, 2015

Related U.S. Application Data

(60) Provisional application No. 61/873,577, filed on Sep. 4, 2013, provisional application No. 61/892,382, filed on Oct. 17, 2013.

(51) Int. Cl.
*G01R 31/308* (2006.01)
*G01R 1/07* (2006.01)
(Continued)

(52) U.S. Cl.
CPC ......... *G01R 1/071* (2013.01); *G01R 31/2632* (2013.01); *G01R 31/2656* (2013.01); *H01L 22/14* (2013.01); *G01R 31/2635* (2013.01)

(58) Field of Classification Search
CPC ............. G01R 31/311; G01R 31/2656; G01R 31/308; G01R 31/2831; G01R 31/2648;
(Continued)

(56) References Cited

U.S. PATENT DOCUMENTS

| 4,812,756 A | 3/1989 | Curtis et al. |
| 5,216,362 A * | 6/1993 | Verkuil .............. G01R 31/2831 |
| | | 250/492.2 |

(Continued)

OTHER PUBLICATIONS

V.N. Faifer et al., Characterization of ultrashallow junctions using frequency-dependent junction photovoltage and its lateral attenuation, Applied Physics Letters, vol. 89, pp. 151123-1-151123-3, Oct. 13, 2006, © 2006 American Institute of Physics.

(Continued)

*Primary Examiner* — Thang Le
(74) *Attorney, Agent, or Firm* — Suiter Swantz pc llo

(57) ABSTRACT

Non-contact measurement of one or more electrical response characteristics of a p-n junction includes illuminating a surface of the p-n junction with light of a first intensity having a modulation or pulsed characteristic sufficient to establish a steady-state condition in a junction photovoltage (JPV) of the p-n junction, measuring a first JPV from the p-n junction within the illumination area, illuminating the surface of the p-n junction with light of an additional intensity, measuring an additional photovoltage from the portion of the p-n junction within the illumination area, determining a photocurrent density of the p-n junction at the first intensity. The non-contact measurement further includes determining the forward voltage, the saturation current density, the ideality factor or one or more I-V curves with the measured first photovoltage, the measured additional photovoltage and/or the determined photocurrent density of the p-n junction.

46 Claims, 12 Drawing Sheets

(51) Int. Cl.
  *G01R 31/26* (2014.01)
  *G01R 31/265* (2006.01)
  *H01L 21/66* (2006.01)

(58) Field of Classification Search
  CPC ............ G01R 31/2632; G01R 31/2635; G01R 31/312; G01R 31/26; G01R 13/04; G01R 13/38; G01R 5/10
  USPC ...... 324/754.23, 97, 754.21, 762.05, 762.07, 324/522, 762.01, 755.01
  See application file for complete search history.

(56) References Cited

U.S. PATENT DOCUMENTS

| | | | |
|---|---|---|---|
| 5,442,297 A * | 8/1995 | Verkuil | G01R 31/2656 257/E21.531 |
| 5,594,567 A * | 1/1997 | Akiyama | G02F 1/135 349/187 |
| 5,663,657 A | 9/1997 | Lagowski et al. | |
| 7,019,513 B1 | 3/2006 | Faifer et al. | |
| 7,414,409 B1 * | 8/2008 | Faifer | G01R 31/311 324/522 |
| 7,642,772 B1 * | 1/2010 | Faifer | G01R 31/2656 324/754.23 |
| 7,679,381 B2 | 3/2010 | Ma | |
| 7,714,596 B2 | 5/2010 | Chen et al. | |
| 8,364,428 B2 * | 1/2013 | Schaus | G01R 31/311 702/57 |
| 8,415,961 B1 * | 4/2013 | Zhao | G01R 31/2648 324/702 |
| 9,093,355 B2 * | 7/2015 | Wang | H01L 33/0008 |
| 2007/0170933 A1 | 7/2007 | Ma | |
| 2007/0170934 A1 | 7/2007 | Ma | |
| 2008/0297189 A1 | 12/2008 | Everaert et al. | |
| 2009/0146240 A1 * | 6/2009 | Carey, III | H01L 31/0236 257/463 |
| 2010/0085073 A1 | 4/2010 | Lagowski et al. | |
| 2010/0153033 A1 | 6/2010 | Schaus et al. | |
| 2011/0301892 A1 * | 12/2011 | Kamieniecki | G01R 31/2656 702/65 |
| 2012/0202299 A1 * | 8/2012 | Lenoble | G01N 21/6408 436/501 |
| 2013/0043875 A1 | 2/2013 | Chen | |
| 2013/0046496 A1 | 2/2013 | Chen | |

OTHER PUBLICATIONS

V. Faifer et al., Measurement of the Diffusion Length in Silicon Wafers with Improved Spatial Resolution, Measurement of the Diffusion Length in Silicon Wafers, Proceedings of 24th ESSDERC 1994, p. 601-604.

* cited by examiner

METHOD AND APPARATUS FOR NON-CONTACT MEASUREMENT OF FORWARD VOLTAGE, SATURATION CURRENT DENSITY, IDEALITY FACTOR AND I-V CURVES IN P-N JUNCTIONS

CROSS-REFERENCE TO RELATED APPLICATIONS

The present application claims the benefit under 35 U.S.C. § 119(e) of U.S. Provisional Application Ser. No. 61/892,382, filed Oct. 17, 2013; and U.S. Provisional Application Ser. No. 61/873,577, filed Sep. 4, 2013. The U.S. Provisional Application Ser. No. 61/892,382 and U.S. Provisional Application Ser. No. 61/873,577 are incorporated herein by reference in the entirety.

TECHNICAL FIELD

The present invention generally relates to non-contact measurement of various electrical response characteristics of p-n junctions of a semiconductor substrate, and, in particular, a non-contact junction photovoltage technique for measuring various response characteristics in heterojunction or homojunction p-n junctions.

BACKGROUND

As the demand for improved semiconductor device performance continues to increase, so too does the need for improved semiconductor device characterization techniques. Semiconductor wafers, such as silicon wafers, play an important role in the fabrication of device structures. Such device structures include, but are not limited to, semiconductor structures for light emitting diodes (e.g., MOCVD grown structures), low energy implanted and laser annealed ultra-shallow junctions, semiconductor solar cells and p-n junction thin film solar cells. Improved monitoring of p-n junction device quality is critical in the development of advanced semiconductor device fabrication. A variety of monitoring and measurement techniques are currently employed to monitor device quality. Currently utilized tracking techniques include a variety of non-contact and contact measurement techniques.

Current-voltage (I-V) curves are commonly used when characterizing diode device performance. I-V curves are typically measured with source-measure units that source a predetermined current and sweep this current over a predetermined range. The voltage required to force the current through the given device is recorded, and the source-measure unit reports a set of paired data-points yielding an I-V curve. I-V curves are very important to device researchers and manufacturers because the measured data can be fit with known equations, which describe the behavior of the given devices. Parameters can be extracted from the fit and offer meaningful insight into the quality of measured devices, as well as potential future reliability. I-V curves are generally limited in the prior art because the use of a source-measure unit for device testing requires finished devices. This is particularly problematic because many junction diode based devices acquire their inherent electronic functionality following front-end processing steps, with additional expensive backend steps required before the devices are finished and before the devices can be tested.

One specific measurement technique includes a four-point probe technique. Advanced 4PP techniques may allow for the measurement of sheet resistance and conductance measurements of p-n junctions. The use of a four-point probe (4PP) to measure sheet resistance and conductance of p-n junctions is generally described in U.S. Pat. No. 7,714,596, issued on May 11, 2010, which is incorporated herein by reference in the entirety. Four-point probe techniques suffer from a variety of drawbacks. For example, four-point probe technique are difficult to implement in a non-destructive inline capacity. Further, p-n junction conductance is generally measured at low reverse bias and depends primarily on shunt resistance, while I-V curves characteristic of real devices (e.g., LEDs, solar cells and the like) depend primarily on recombination characteristics at high forward bias conditions.

Additional techniques for measuring I-V curves and electroluminescence include spring loaded probe contact techniques. Spring loaded contact measurement techniques are described generally in U.S. Pat. No. 7,679,381, issued on Mar. 16, 2010; U.S. Patent Publication No. 2013/0043875, filed on Dec. 21, 2011; and U.S. Patent Publication No. 2013/0046496, filed on Dec. 21, 2011, which are each incorporated herein by reference in the entirety. The spring loaded probe technique is based on the measurement of I-V curves and electroluminescence intensity stimulated by forward voltage, which is applied to the spring loaded probe with reference to the bottom n-layer of the junction, connected through the edge of the wafer with a second probe. This technique also suffers from a number of disadvantages. One of the primary disadvantages of this techniques includes the failure to account for the lateral current in the p-n junction layers, which is dependent on sheet resistance, and leads to a reduction in the measured current density, especially under reverse bias. In addition, this method suffers from the presence of measurement artifacts related to the contamination, high contact resistance, alignment difficulties, the present of particles and the like.

It is evident that the prior art includes a number of deficiencies. Therefore, it would be desirable to provide a method and system that cure these deficiencies of the prior art identified above.

SUMMARY

An apparatus for contactless measurement of one or more characteristics of a p-n junction is disclosed, in accordance with one embodiment of the present disclosure. In one illustrative embodiment, the apparatus may include an illumination unit for illuminating a surface of a p-n junction with light at one or more selected intensities and one or more selected frequencies. In another illustrative embodiment, the apparatus may include a measurement unit including at least a first measurement element including a first transparent electrode positioned proximate to the p-n junction and configured to transmit light from the illumination unit to the surface of the p-n junction. In one illustrative embodiment, the first transparent electrode has a first area for measuring a junction photovoltage corresponding with the first area within the illuminated area. In another illustrative embodiment, the first area of the first electrode is smaller than the area illuminated by the illumination sub-system in order to limit the effect of lateral spreading of the junction photovoltage on the measurement of the junction photovoltage. In another illustrative embodiment, the apparatus may include a second measurement element including a second electrode having a second area. In another illustrative embodiment, the second electrode may be positioned within the illumination area and outside of the first area of the first electrode.

In another illustrative embodiment, the second electrode and the first electrode are configured to monitor a one-dimensional condition of the junction photovoltage.

In another illustrative embodiment, the apparatus includes a controller communicatively coupled to at least the measurement unit and the illumination unit. In one illustrative embodiment, the controller may control at least one of light intensity or frequency of the light from the illumination unit. In another illustrative embodiment, the controller may receive one or more measurements of the at least one of junction photovoltage or the capacitance from the measurement unit at the one or more selected light intensities and one or more selected frequencies. In another illustrative embodiment, the controller may determine at least one of photocurrent density of the p-n junction, a forward voltage of the p-n junction, a saturation current density of the p-n junction, an ideality factor of the p-n junction or one or more I-V curves of the p-n junction with one or more measurements of the junction photovoltage received from the measurement unit.

In another illustrative embodiment, the apparatus includes a vibrating element configured to mechanically drive the motion of at least the first transparent electrode. In another illustrative embodiment, the controller is configured to measure one or more junction photovoltage values by calculating a difference between a first surface potential measured with the vibrating first transparent electrode during a dark illumination condition and an additional surface potential measured with the vibrating first transparent electrode during illumination of light of a first intensity in a steady-state condition.

A method for contactless measurement of one or more characteristics of a p-n junction is disclosed, in accordance with one embodiment of the present disclosure. In one illustrative embodiment, the method includes illuminating an illumination area of a surface of a p-n junction with light of a first intensity, wherein the light of the first intensity is sufficient to establish a steady-state condition in a junction photovoltage of the p-n junction. In another illustrative embodiment, the method includes measuring a first junction photovoltage from a portion of the p-n junction within the illumination area illuminated by the light of the first intensity with a transparent electrode positioned within the illumination area and proximate to the surface of the p-n junction. In another illustrative embodiment, the method includes illuminating the area of the surface of the p-n junction with light of an additional intensity, wherein the light of the additional intensity is sufficient to establish a steady-state condition in a junction photovoltage of the p-n junction. In another illustrative embodiment, the method includes measuring an additional photovoltage from the portion of the p-n junction within the illumination area illuminated by the light of the additional intensity with the transparent electrode. In another illustrative embodiment, the method includes determining a photocurrent density of the p-n junction at the first intensity. In another illustrative embodiment, the method includes determining at least one of the forward voltage of the p-n junction, saturation current density of the p-n junction or the ideality factor with at least one of the measured first photovoltage, the measured additional photovoltage or the determined photocurrent density of the p-n junction. In another illustrative embodiment, the method includes generating one or more I-V curves of the p-n junction by acquiring a junction photovoltage and a corresponding photocurrent (or photocurrent density) at each of a plurality of illumination intensities.

A method for contactless measurement of one or more characteristics of a p-n junction is disclosed, in accordance with one embodiment of the present disclosure. In one illustrative embodiment, the method includes illuminating an illumination area of a surface of a p-n junction with light of a first intensity, wherein the light of the first intensity is sufficient to establish a steady-state condition in a junction photovoltage of the p-n junction. In another illustrative embodiment, the method includes measuring a first junction photovoltage from a portion of the p-n junction within the illumination area illuminated by the light of the first intensity with a first transparent electrode having a first area and positioned within the illumination area and proximate to the surface of the p-n junction. In another illustrative embodiment, the method includes illuminating the illumination area of the surface of the p-n junction with light of an additional intensity, wherein the light of the additional intensity is sufficient to establish a steady-state condition in a junction photovoltage of the p-n junction. In another illustrative embodiment, the method includes measuring an additional photovoltage from the portion of the p-n junction within the illumination area illuminated by the light of the additional intensity with the first transparent electrode. In another illustrative embodiment, the method includes monitoring one dimensional character of at least one of the first junction photovoltage or the additional junction voltage by measuring a junction photovoltage from a portion of the p-n junction within the illumination area with a second transparent electrode positioned within the illumination area and proximate to the surface of the p-n junction, the second transparent electrode having a second area external to the first area of the first transparent electrode. In another illustrative embodiment, the method includes illuminating the illumination area of the surface of the p-n junction with light of the first intensity at a modulation frequency sufficient to achieve non-steady-state conditions in the junction photovoltage of the p-n junction. In another illustrative embodiment, the method includes measuring a high frequency junction photovoltage from the portion of the p-n junction within the illumination area with the first transparent electrode. In another illustrative embodiment, the method includes acquiring a capacitance of the p-n junction. In another illustrative embodiment, the method includes determining a photocurrent density of the p-n junction with at least one of the high frequency junction voltage, the capacitance of the p-n junction and the modulation frequency. In another illustrative embodiment, the method includes determining at least one of the forward voltage of the p-n junction, the saturation current density of the p-n junction or the ideality factor of the p-n junction with at least one of the measured first photovoltage, the measured additional photovoltage or the determined photocurrent density of the p-n junction. In another illustrative embodiment, the method includes generating one or more I-V curves of the p-n junction by acquiring a junction photovoltage and a corresponding photocurrent at each of a plurality of illumination intensities.

A method for contactless measurement of one or more characteristics of a p-n junction is disclosed, in accordance with one embodiment of the present disclosure. In one illustrative embodiment, the method includes illuminating an area of a surface of a p-n junction with light of a first intensity, wherein the light of the first intensity is sufficient to establish a steady-state condition in a junction photovoltage of the p-n junction. In another illustrative embodiment, the method includes measuring a first junction photovoltage from a portion of the p-n junction within the illumination area by determining a difference between a first surface potential measured during a dark illumination condition and an additional surface potential measured during illumination of the light of the first intensity in a steady-state condition with a first vibrating transparent electrode. In another illustrative embodiment, the method includes illuminating the area of the surface of the p-n junction with light of an additional intensity, wherein the light of the additional intensity is sufficient to establish a steady-state condition in a junction photovoltage of the p-n junction. In another illustrative embodiment, the method includes measuring an additional photovoltage from the portion of the p-n junction within the illumination area by determining a difference between the first surface potential measured during the dark illumination condition and an additional surface potential measured during illumination of the light of the additional intensity in a steady-state condition with the first vibrating transparent electrode. In another illustrative embodiment, the method includes monitoring one-dimensional character of at least one of the first junction photovoltage or the additional junction voltage by measuring a junction photovoltage from a portion of the p-n junction within the illumination area with a second vibrating transparent electrode positioned within the illumination area and proximate to the surface of the p-n junction, the second vibrating transparent electrode having a second area external to the first area of the first transparent electrode. In another illustrative embodiment, the method includes determining a photocurrent density of the p-n junction at the first intensity. In another illustrative embodiment, the method determining at least one of the forward voltage of the p-n junction, saturation current density of the p-n junction or the ideality factor with at least one of the measured first photovoltage, the measured additional photovoltage or the determined photocurrent density of the p-n junction. In another illustrative embodiment, the method includes generating one or more I-V curves of the p-n junction by acquiring a junction photovoltage and a corresponding photocurrent at each of a plurality of illumination intensities.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Figure 1A:
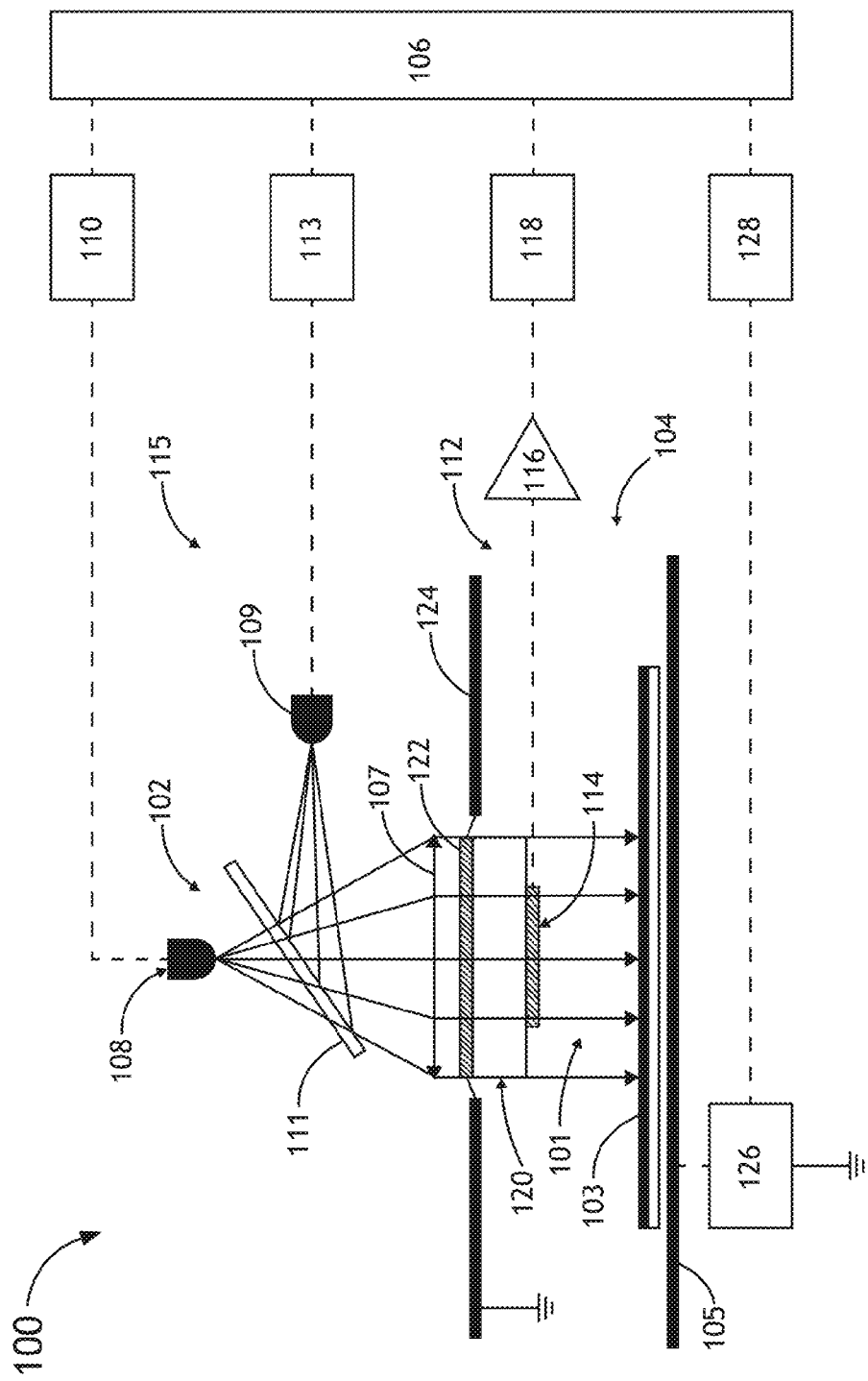
FIG. 1A is a block diagram illustrating an apparatus for contactless measurement of one or more characteristics of a p-n junction, in accordance with one embodiment of the present disclosure.

Reference will now be made in detail to the subject matter disclosed, which is illustrated in the accompanying drawings.

Referring generally to FIGS. 1A through 5, a system and method for contactless measurement of one or more characteristics of a p-n junction is described in accordance with the present disclosure. Embodiments of the present disclosure are directed to a non-contact junction photovoltage (JPV) technique suitable for measuring various electrical response characteristics of a p-n junction of a semiconductor substrate, such as a heterojunction or a homojunction.

The non-contact measurement technique(s) described throughout the present disclosure provide for the accurate measurement and mapping of one or more characteristics of a p-n junction. The non-contact measurement technique(s) of the present disclosure provide for the measurement and mapping of forward voltage, saturation current density and ideality factor in p-n junctions. By way of non-limiting example, the techniques described throughout the present disclosure may provide for the monitoring of forward voltage, saturation current density, ideality factor and I-V curves in semiconductor structures (e.g., MOCVD grown) for light emitting diodes (LEDs), low energy implanted and laser annealed ultra-shallow junctions, solar cells (e.g., silicon solar cells) and homo or hetero p-n junction in thin film solar cells.

The embodiments and techniques of the present disclosure may be particularly useful in measuring and mapping the saturation current density and ideality factor in homo or hetero p-n junctions at high light intensity and high forward bias conditions on product wafers, independent of lateral JPV spreading. The embodiments and techniques of the present disclosure may be used to measure external quantum efficiency (and thus photocurrent density) prior to metallization and without making contact to the measured device. The embodiments and techniques of the present invention may be particularly useful in monitoring millisecond annealing conditions of ultra-shallow junctions since leakage current at high forward bias is more sensitive to end-of-range damage.

One or more of the above characteristics may be found using measured quantities of one or more measured photovoltages of the p-n junction obtained at multiple illumination intensities and/or one or more photocurrent densities. In addition, the present disclosure provides for the measurement of one or more I-V curves of a p-n junction through the mapping out of multiple photovoltages and photocurrents acquired at multiple illumination intensities and/or modulation frequencies. By way of non-limiting example, the embodiments and techniques of the present disclosure may serve useful in measuring non-contact forward voltage I-V curves on LED and PV wafers or structures prior to the fabrication and metallization of devices.

Some embodiments of the present disclosure serve to monitor lateral JPV spreading caused by the lateral drift of photo carriers in large area p-n junctions. It is further noted herein that advanced two-dimensional junction photovoltage theoretical techniques have been implemented to optimize, or at least improve, the probe design and the measurement of the various characteristics described throughout the present disclosure.

As described throughout the present disclosure, some embodiments of the present disclosure serve to measure one or more junction photovoltage signal using one or more transparent electrodes, whereby the one or more transparent electrodes (and corresponding circuitry) may measure a steady-state JPV signal stimulated by a modulated illumination signal having a frequency low enough to cause steady-state behavior in the JPV signal. Other embodiments of the present disclosure may measure the steady-state JPV signal utilizing a non-contact differential surface potential technique (e.g., Kelvin probe technique). Additional embodiments of the present disclosure may measure photocurrent densities via the measurement of non-steady-steady JPV signals, which may be generated by increasing the modulation frequency of the modulated illumination signal to sufficient levels, in one or more p-n junctions along with corresponding p-n junction capacitance values (e.g., measured values, calculated values or user-entered values).

A non-contact junction photovoltage technique for measurement of sheet resistance and conductance of p-n junctions at low forward bias conditions is described in U.S. Pat. No. 7,019,513 to V. Faifer et al., issued on Mar. 28, 2006, which is incorporated herein by reference in the entirety. This technique is limited to the measurement of junction photovoltage inside and outside of a given illumination area for tested and calibration wafers.

Kelvin probe measurements of the diffusion length of minority characters is described in U.S. Pat. No. 5,663,657 to Lagowski et al., issued on Sep. 2, 1997, which is incorporated herein by reference in the entirety. Kelvin probe techniques used to measure near surface doping are described in U.S. Pat. No. 5,216,362 to Verkuil, issued on Jun. 1, 1993, which is incorporated herein by reference in the entirety.

FIGS. 1A-1G illustrates a system 100 for measuring one or more characteristics of one or more p-n junctions, in accordance with one or more embodiments of the present disclosure. In some embodiments, the one or more characteristics measured by system 100 include at least one of photocurrent density, forward voltage, saturation current density, ideality factor or one or more I-V curves of one or more p-n junctions.

Referring now to FIG. 1A, in one embodiment, the system 100 includes an illumination unit 102, a measurement unit 104 and a controller 106 communicatively coupled to the illumination unit 102 and the measurement unit 104. In one embodiment, the controller 106 is configured to direct the illumination unit 102 to illuminate a semiconductor substrate including a p-n junction 103 with light having one or more selected characteristics (e.g., intensity, modulation frequency and the like). In turn, the controller 106 may receive measurements of electrical response characteristics of the p-n junction, such as JPV, from the measurement unit 104. Further, the controller 106 may determine the photocurrent density, forward voltage, saturation current density, ideality factor and/or one or more I-V curves of one or more p-n junctions 103 based on the measured characteristics and the various relationships described throughout the present disclosure.

In one embodiment, a semiconductor substrate including one or more p-n junctions 103 is disposed on a chuck 105. In another embodiment, the chuck 105 includes a conducting chuck (e.g., metal chuck). In another embodiment, the chuck 105 includes a metal chuck connected to ground. It is noted herein that the chuck is not limited to a conducting or metal chuck and the description above is provided merely for illustrative purposes. For example, the chuck may include non-conducting chuck. In another embodiment, one or more calibrating signals of the present disclosures may be applied to the edge of the substrate 103 (rather than through the chuck 105, as described further herein).

In one embodiment, the illumination unit 102 illuminates an area of a semiconductor substrate including the p-n junction 103 with light 104. In another embodiment, the illumination unit 102 illuminates the surface of the p-n junction 103 with light at one or more selected intensities. In another embodiment, the illumination unit 102 illuminates the surface of the p-n junction 103 with light at one or more selected modulation frequencies. For example, the illumination source 108 may output a modulated light signal modulated at a selected modulation frequency. For instance, the modulation frequency may correspond to a steady-state condition or a non-steady-state condition. By way of another example, the illumination source 108 may output a pulsed light signal. In another embodiment, the illumination unit 102 illuminates the surface of the p-n junction 103 with light including a selected wavelength or range of wavelengths.

The illumination source 108 may include any illumination source known in the art suitable for providing modulated or pulsed light. For example, the illumination unit 102 may include an illumination source 108, such as, but not limited to, a light emitting diode (LED), multiple LEDs, one or more lasers, a flashlamp, or a shuttered lamp. For the remainder of the present disclosure, the illumination source 108 of the illumination unit 102 is described in the context of an LED. It is noted herein that the illumination source 108 is not limited to an LED and this simplification is provided merely for purposes of clarity and it is contemplated herein that the illumination source 108 may include any additional type of light source (e.g., a laser).

In another embodiment, the illumination unit 102 includes a signal generator 110 coupled to the LED 108 and the controller 106. In this regard, the controller 106 may direct the signal generator 110 to drive the LED 108 in order to generate a desired illumination output. For example, the signal generator 110 may cause the LED 108 to output a modulated light signal having a selected modulation frequency. For example, the signal generator 110 may cause the LED 108 to output a modulated light signal having a modulation frequency sufficiently low to cause a steady-state condition in the stimulated JPV signal of the p-n junction 103. By way of another example, the signal generator 110 may cause the LED 108 to output a modulated light signal having a modulation frequency sufficiently high to cause a non-steady-state condition in the stimulated JPV signal of the p-n junction 103. By way of another example, the signal generator 110 may cause the LED 108 to output a light pulse at a selected time (i.e., pulsed light signal).

In another embodiment, the measurement unit 104 includes a first measurement element 112 for measuring the JPV signal for a selected area within the illuminated area of the p-n junction 103. In one embodiment, the first measurement element 112 includes a first transparent electrode 114 positioned proximate to the p-n junction 103 and configured to transmit light from the LED 108 to the surface of the p-n junction 103. In this regard, the first transparent electrode 114 has a first area for measuring the JPV corresponding with the first area (i.e., area subtended by the first electrode 114) within the illuminated area 101 of the p-n junction 103. As described in additional detail further herein, selecting an area of electrode 114 smaller than the illumination area 101 aids in limiting the impact of lateral spreading of the junction photovoltage on the measurement of the JPV signal.

In another embodiment, the first transparent electrode 114 is disposed on a surface of a transparent element 120. In this regard, the first transparent electrode 114 may be disposed on the surface of the transparent element 120 facing the p-n junction 103, as shown in FIG. 1A. In one embodiment, the first transparent electrode 114 may be disposed on the bottom surface of the transparent element 120. In another embodiment, the transparent element 120 may include, but is not limited to, one or more transparent plates 120, as shown in FIG. 1A. For example, the transparent element may include, but is not limited to, a glass plate. It is noted herein that the construction of the transparent element 120 is not limited to a glass plate or a single plate configuration. Rather, the description provided above is provided merely for illustrative purposes. It is noted herein that any material transparent to the illumination emitted by the illumination unit 102 is suitable for implementation within the context of the present invention. Further, the transparent element 120 may include multiple transparent plates or an alternative structure or structures suitable for securing the electrodes.

In another embodiment, an additional transparent electrode 122 is disposed on a surface of the transparent element 120 opposite of the first transparent electrode 114. For example, as shown in FIG. 1A, the additional transparent electrode 122 may be disposed on the top surface of the transparent element 120. It is recognized herein that while the present disclosure describes the additional transparent electrode 122 and the first transparent electrode 114 as being disposed on a common transparent plate, as shown in FIG. 1A, it is contemplated herein that the electrodes 114, 122 may be spatially secured and/or electrically insulated from one another in any manner known in the art. For instance, the electrodes 114 and 122 may each be disposed on separate spatially separated transparent plates (not shown). For example, a first transparent plate may be used to secure the first transparent electrode 114, while a second transparent plate, positioned above the first transparent plate, may be used to secure the additional transparent electrode 122.

In another embodiment, the top electrode 122 is connected to ground in order to limit influence of the electric field associated with the LED 108 on the first transparent electrode 114. In another embodiment, the top transparent electrode 122 is coupled to a grounded shielding element 124. For example, the grounded shielding element may include, but is not limited to, a ring-shaped grounded shielding element. It is noted herein that the grounded shielding element is not limited to a ring shape and it is further noted that the grounded shielding element 124 may take on any suitable shape known in the art, such as but not limited to, a circular ring, a square ring, a polygonal ring, an oval ring and the like. It is further noted that the grounded shielded element 124 is not limited to the planar configuration depicted in FIG. 1A, which is provided merely for illustrative purposes. For example, the grounded shield element 124 may take on any shape, such as, but not limited to, a tube.

In another embodiment, the illumination unit 102 may include one or more illumination optical elements. In one embodiment, the illumination unit 102 includes one or more lenses 107. In one embodiment, the lens 107 optically couples the output of the LED 108 with the surface of the p-n junction 103. In this regard, illumination 101 from the LED 108 may pass through the lens 107, the top transparent electrode 122, the transparent plate 120 and the bottom first transparent electrode 114 prior to impinging on the p-n junction 103 surface, as shown in FIG. 1A. It is noted herein that the system 100 may include any optical element known in the art suitable to collect, focus, direct and/or filter illumination emitted by the LED 108.

In another embodiment, the first measurement element 112 of measurement unit 104 includes one or more signal processing elements configured to process a measured signal prior to transmission to the controller 106. For example, the measurement unit 104 may include, but is not limited to, a preamplifier 116 for amplifying the signal from the electrode 114. In another embodiment, the measurement unit 104 includes a demodulator and/or a detector 118. Further, upon amplification, demodulation and/or detection, the signal from the electrode 114 is received by an interface of the controller 106. In another embodiment, the system 100 includes a light detector unit 115 configured to detect and/or monitor one or more characteristics (e.g., intensity, modulation frequency, and the like) of the illumination emitted by the LED 108. In one embodiment, the light detector unit 115 includes a beam splitter 111. In another embodiment, the detector unit 115 includes a light detection element 109. For example, the light detection element 109 may include, but is not limited to, one or more photodiodes 109. In one embodiment, the beam splitter 111 may direct a portion of the initial illumination from the LED 108 to the detection element 109. In another embodiment, the detector unit 115 includes one or more signal processing elements for processing the output of the detection element 109 upon detection of light from the LED 108. For example, the one or more signal processing elements includes any signal processing circuitry known in the art, such as, but not limited to, one or more amplifier 113. In another embodiment, the output of the detection element 109 is coupled to the controller 106. In this regard, the controller 106 may monitor the performance of the illumination unit 102.

In another embodiment, the system 100 includes a signal generator 128 coupled to the wafer chuck 105 through switch 126. In another embodiment, the switch 126 is couple to ground. In another embodiment, the signal generator 128 is coupled to controller 106, whereby the controller 106 may direct the signal generator 128 to apply a selected signal to the chuck 105. As described further herein, the signal generator 128 may be used to apply an AC signal to the chuck 105 through switch 126 in order to calibrate one or more photovoltage signals.

Figure 1B:
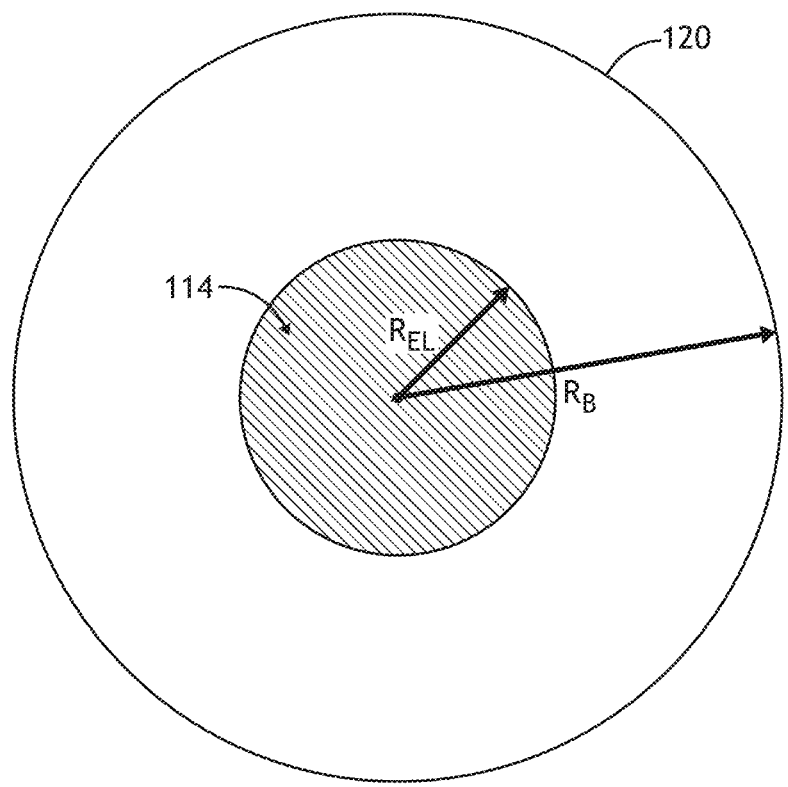
FIG. 1B illustrates top view of a first transparent electrode disposed on a transparent element, in accordance with one embodiment of the present disclosure.

In one embodiment, the first area of the first electrode 114 is selected to be smaller than the area illuminated by the LED 108 in order to limit the effect of lateral spreading of the junction photovoltage on measurements of the junction photovoltage. For example, as shown in FIG. 1B, in a circular geometry, the radius, $R_{EL}$, of first electrode 114, may be smaller than the radius of glass plate 120 and illumination beam 101 (from LED 108), $R_B$. It is noted herein that, while the radius associated with the illumination beam 101 and the radius associated with the glass plate 120 are depicted in FIG. 1B as being equal in magnitude, this is not a limitation on the present disclosure and should be interpreted merely as illustrative.

It is noted herein that the shape of the first transparent electrode 114 is not limited to a circular disk shape as depicted in FIGS. 1A-1B. Rather, the shape of the first transparent electrode 114 should be interpreted merely as illustrative. It is noted herein that first transparent electrode 114 may take on any suitable shape known in the art. For example, the first transparent electrode may take on a circular disk shape, a square shape, rectangle shape, an oval shape, a polygonal shape and the like.

Figure 1C:
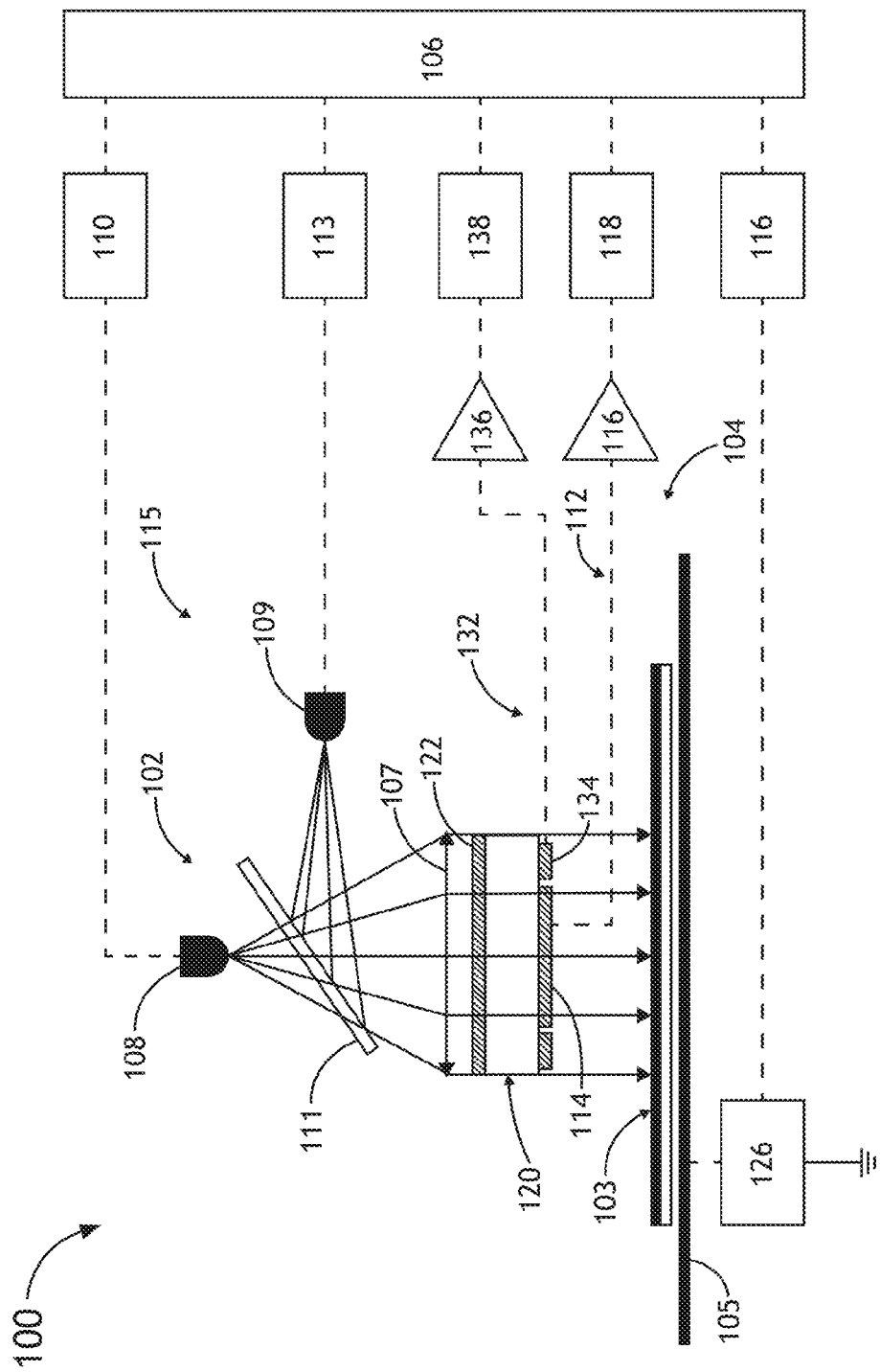
FIG. 1C is a block diagram illustrating an apparatus for contactless measurement of one or more characteristics of a p-n junction, in accordance with one embodiment of the present disclosure.

Referring now to FIG. 1C, a second measurement element 132 of the measurement unit 104 is depicted, in accordance with one or more embodiments of the present disclosure. In one embodiment, the second measurement element 132 includes a second transparent electrode 134. In one embodiment, the second transparent electrode 134 is arranged peripheral to the first transparent electrode 114. For example, the second transparent electrode 134 may surround or encompass the first transparent electrode 114. In this regard, the area associated with the second transparent electrode 134 falls within the illumination area 101 from the LED 108, but is external to the area associated with the first transparent electrode 114.

Figure 1D:
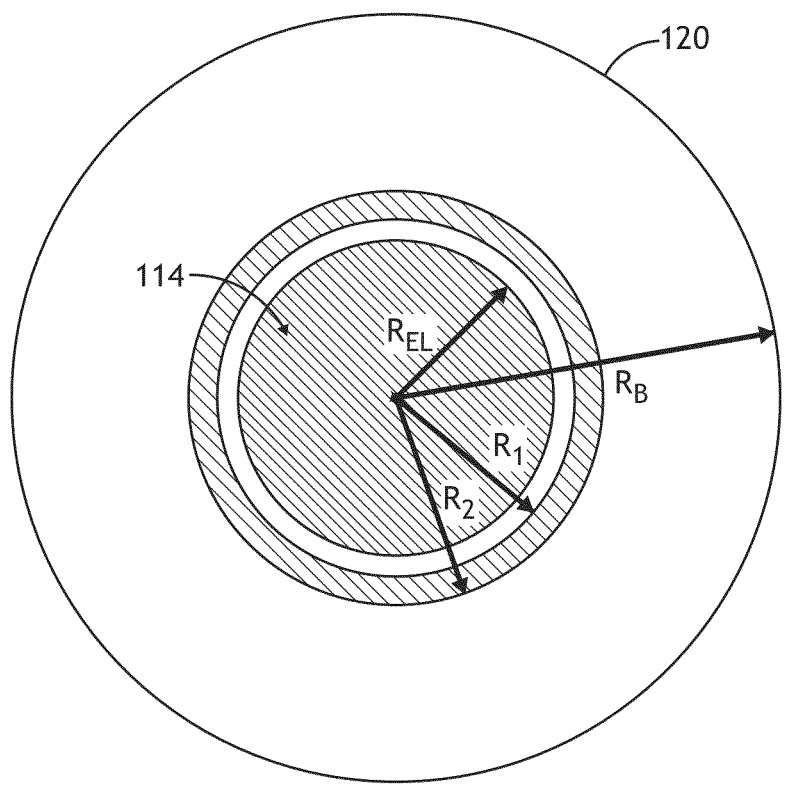
FIG. 1D illustrates a top view of a second peripheral transparent electrode positioned outside of the first transparent electrode disposed on a transparent element, in accordance with one embodiment of the present disclosure.

For example, the second transparent electrode may be arranged concentrically with respect to the first transparent electrode 114, as shown in FIGS. 1C and 1D. For instance, the first electrode 114 may have a circular disk shape, while the second electrode 134 has a circular ring shape that surrounds the central first electrode 114.

For example, as shown in FIG. 1D, in a circular geometry, the radius, $R_{EL}$, of first electrode 114, may be smaller than the radius of glass plate 120 and illumination beam 101 (from LED 108), $R_B$. Further, the inside radius R1 and the outside radius R2 are both selected to be larger than the radius of the first transparent electrode 114, but smaller than the radius of glass plate 120 and illumination beam 101 (from LED 108), $R_B$ It is noted herein that the circular disk/ring depiction described herein is not limiting and is provided merely for illustrative purposes. It is recognized herein that the first electrode 114 and the second electrode 134 may take on any shapes (e.g., complementary shapes) known in the art, which allow the area of the second electrode to fall outside of the area associated with the first electrode 114.

In one embodiment, the second transparent electrode 134, in conjunction with the first transparent electrode 114, may monitor the one-dimensional condition or characteristics associated with a junction photovoltage signal of the p-n junction 103. For example, at a given intensity of light emitted by the diode 108, the first transparent electrode 114 may measure a junction photovoltage $V_1$. Further, the first transparent electrode 114 may measure a junction photovoltage $V_1$ after calibration utilizing the chuck signal, as described herein. In addition, at the same light intensity, the second transparent electrode 134 may measure a junction photovoltage $V_{11}$. Further, the second transparent electrode 134 may measure a junction photovoltage $V_{11}$ also following calibration utilizing the chuck signal. In this regard, the one dimensional nature of a given junction photovoltage may be monitored by comparing $V_1$ and $V_{11}$ (e.g., calculating a ratio between $V_1$ and $V_{11}$, calculating a difference between $V_1$ and $V_{11}$ and the like). It is further noted herein that this procedure may be repeated at various intensities, wavelengths and modulation frequencies.

In another embodiment, the second measurement element 132 of measurement unit 104 includes one or more signal processing elements configured to process a measured signal prior to transmission to the controller 106. For example, the second measurement element 132 (similar to the first measurement element 112) may include, but is not limited to, a preamplifier 136 for amplifying the signal from the electrode 134. In another embodiment, the second measurement element 132 includes a demodulator and/or a detector 138. Further, upon amplification, demodulation and/or detection, the signal from the electrode 134 is received by an interface of the controller 106.

Figure 1E:
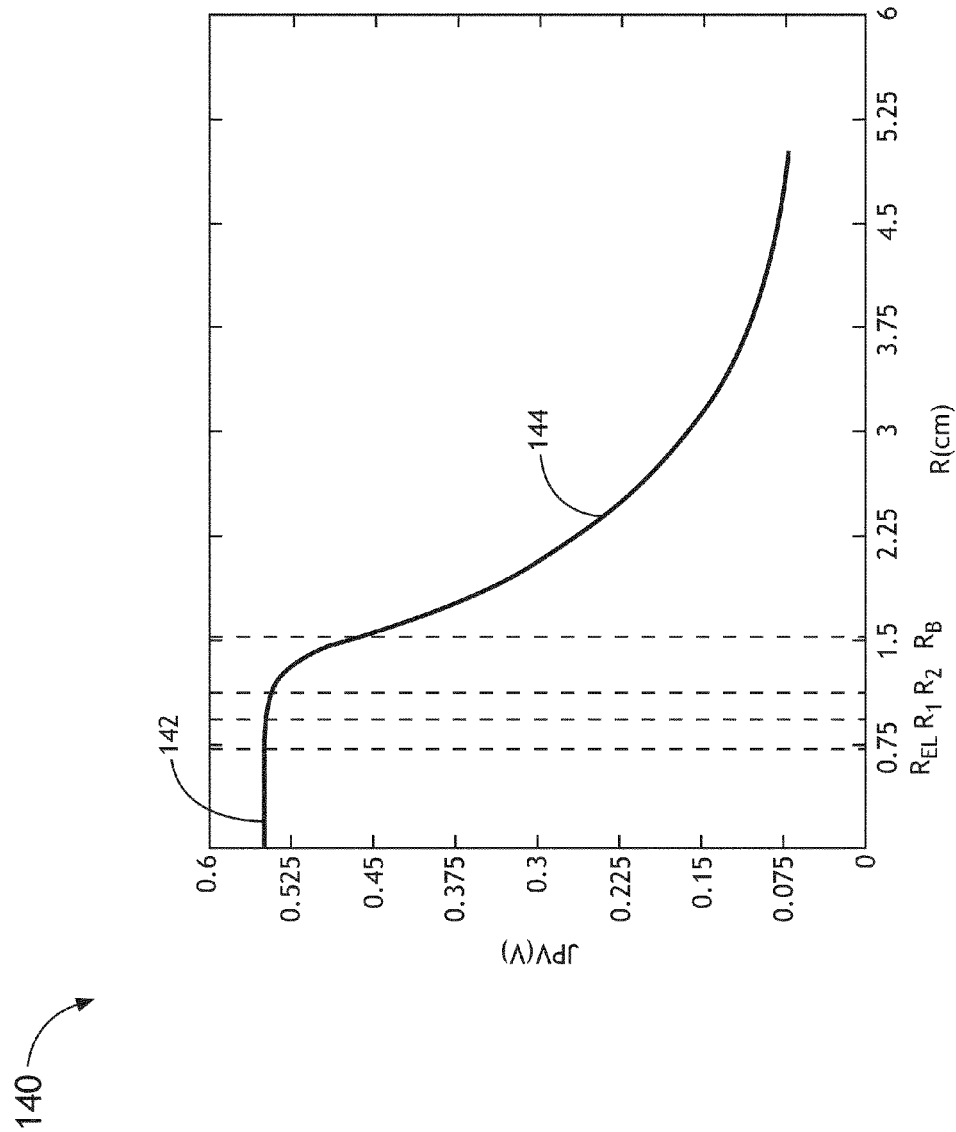
FIG. 1E illustrates a graph of a junction photovoltage signal as a function of radius as measured from the center of a central transparent electrode, in accordance with one embodiment of the present disclosure.

FIG. 1E illustrates a graph 140 depicting a JPV signal (in V) measured as a function of radius (in cm) relative to the center of the first electrode 114, in a circular geometry. As previously described, the first electrode 114, defined by radius $R_{EL}$, and the second electrode, bounded by $R_1$ and $R_2$, can be used to monitor the one-dimensional nature of the JPV signal as a function of R. As shown in region 142 of the JPV curve of FIG. 1E, the voltage is relatively constant with respect to R for radius values less than approximately 1 cm. It is further recognized herein that comparison of JPV signals with the first electrode 114 and the second electrode 134, in the example of FIG. 1E, would yield a ratio of $V_1$ and $V_{11}$ of nearly unity, as the JPV signal fall off 144 occurs measurably outside of the outside radius $R_2$ of the second electrode 134. In cases where the JPV fall off occurs within the outside radius $R_2$ of the second electrode 134, the ratio of $V_1$ and $V_{11}$ would indicate such a fall off. It is noted herein that the above description related to the size and other parameters of the first transparent electrode are not limiting and should be interpreted merely as illustrative.

Figure 1F:
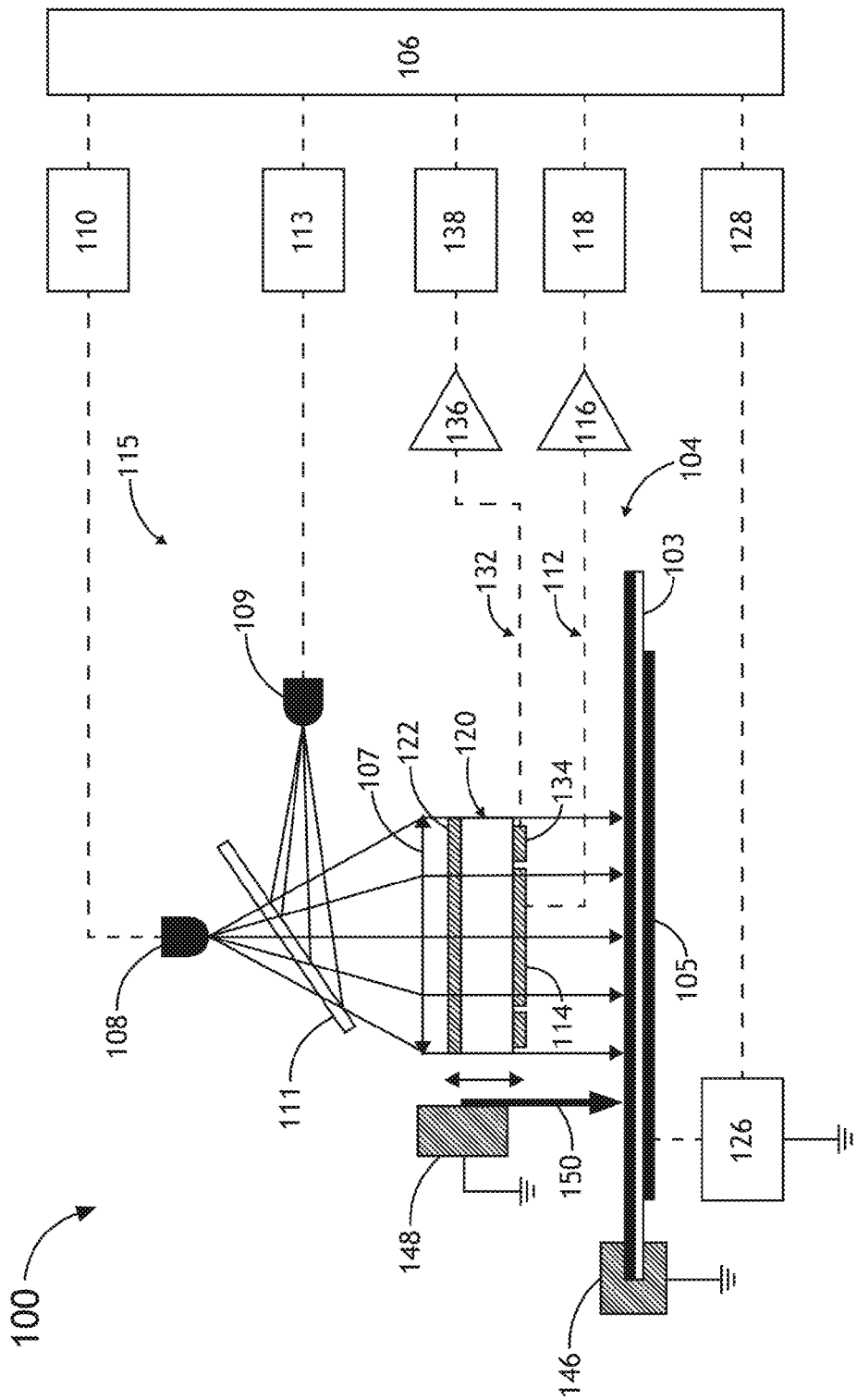
FIG. 1F is a block diagram illustrating an apparatus for contactless measurement of one or more characteristics of a p-n junction, in accordance with one embodiment of the present disclosure.

Referring now to FIG. 1F, a conducting pad 148 electrically connecting p- and n-layers of the p-n junction 103 is depicted, in accordance with one or more embodiments of the present invention. In one embodiment, the conducting pad 146 includes a soft metal or conducting elastic polymer pad for electrically connecting p- and n-layers of the p-n junction 103. It is noted herein that the conducting pad 146 may serve to decrease resistance between the p- and n-layers, thereby decreasing the recovery time of the surface potential following impulse illumination for a p-n junction with high shunt resistance.

In another embodiment, the system 100 includes an electrode 150 (e.g., metal or conducive elastic polymer electrode) mechanically coupled to a vertical stage 148 and is configured to provide grounding of the top p-n junction layer near the first transparent electrode 114. It is noted herein that such a ground configuration may aid increasing the throughput of the system 100.

Figure 1G:
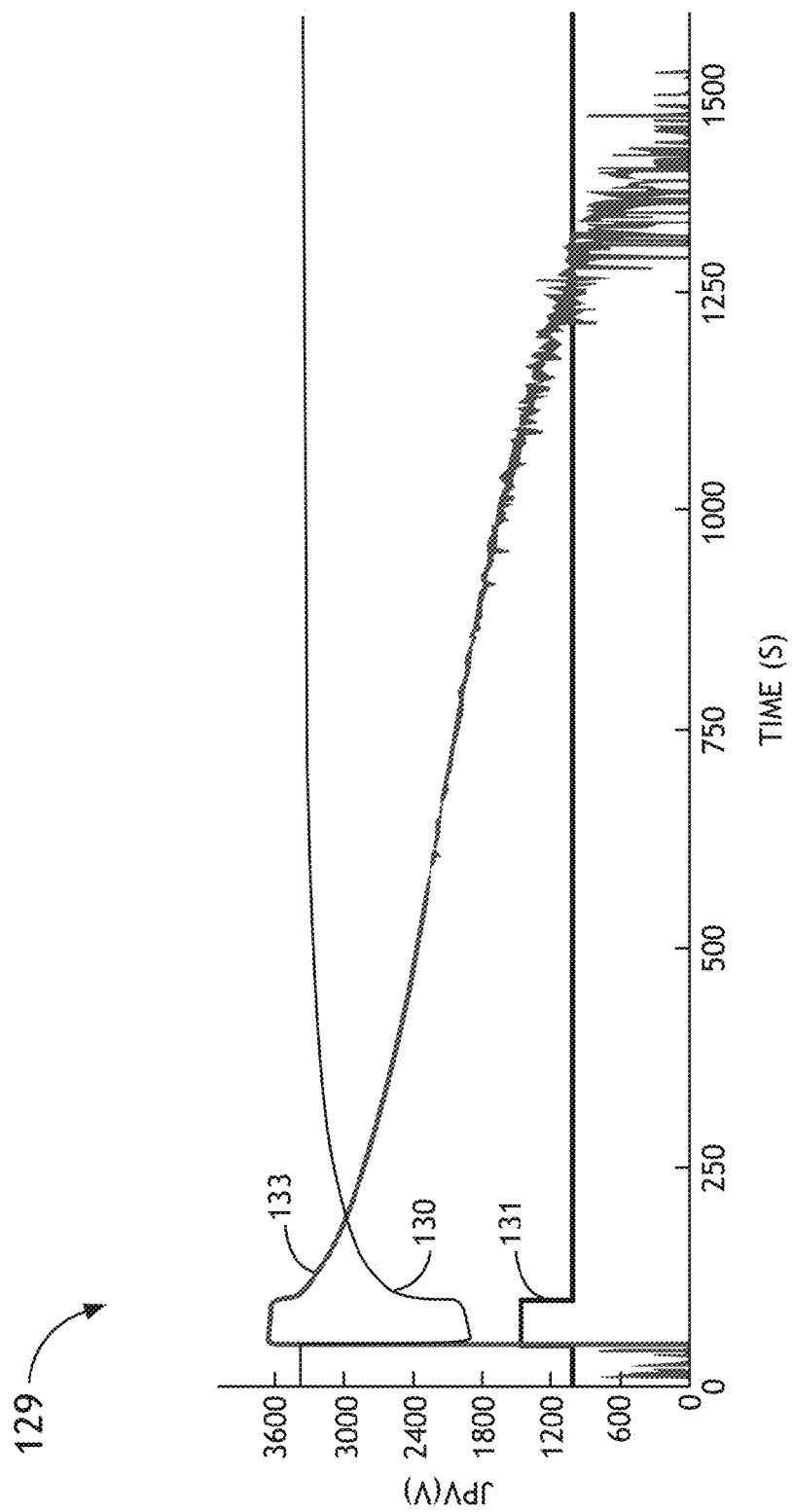
FIG. 1G illustrates a graph of an impulse illumination signal, the junction photovoltage stimulated by the impulse signal and the derivative of the stimulated junction photovoltage, in accordance with one embodiment of the present disclosure.

FIG. 1G illustrates a graph 129 depicting a pulsed illumination 131 and a JPV signal 130, in accordance with one embodiment of the present invention. As shown in FIG. 1G, the impulse of light of the pulse illumination signal incident on the p-n junction 103 serves to stimulate a JPV signal 130 in the p-n junction 103. In addition, the JPV signal in logarithmic scale is depicted by curve 133, where the associated decay slope at low JPV values may be used for the calculation of shunt resistance.

In one embodiment, the system 100 may measure the steady-state and one-dimensional condition JPV signal of the p-n junction 103 as a function of the intensity of light from the LED 108. In another embodiment, the system 100 may measure a JPV signal under non-steady-state conditions. Further, based on the steady-state JPV signal measurements, non-steady-state JPV signals, and/or acquired capacitance values (e.g., independent measured or calculated) of the p-n junction 103, the controller 106 may determine one or more electrical characteristics associated with the p-n junction 103. The electrical characteristics determined via the above measurements may include, but are not limited to, photocurrent density, forward voltage of the p-n junction, the saturation current density of the p-n junction or the ideality factor of the p-n junction with at least one of the measured first photovoltage, the measured additional photovoltage or the determined photocurrent density of the p-n junction.

In one embodiment, a steady-state condition of the JPV is achieved by utilizing a light modulation frequency sufficiently low to achieve full saturation of the JPV signal during "on" periods. In another embodiment, a stead state condition of the JPV is achieved by utilizing pulsed light. For example, the pulsed light signal 131 of FIG. 1G may be utilized to generate a steady-state JPV signal, such as signal 130. It is noted herein that pulsed illumination may be particularly useful when high shunt resistance and/or low leakage is present in the p-n junction 103 and the JPV has a relatively long decay time, as shown in curve 130 of FIG. 1G. Such a set of conditions may prevent a JPV signal of a p-n junction 103 from recovering during "off" periods of a modulated light signal. It is noted herein that an accurate measurement of voltage may be acquired by measuring the difference in JPV levels between (i) a low intensity phase (e.g., full dark) and (b) a high intensity phase (e.g., full light). It is further noted herein that, under one-dimensional and steady-state conditions, the junction photovoltage, V, can be determined by:

$$J_L = I_0 \cdot [\exp(q \cdot V/nkT) - 1] + V/R_{SH} \quad (1)$$

where $J_L$ is the photocurrent density, q is the charge of an electron, k is Boltzman's constant, T is the temperature, $R_{SH}$ is the shunt resistance of the p-n junction, n is the ideality factor of the p-n junction and $I_0$ is the saturation current density of the p-n junction.

Further, at low illumination intensity for the case where $V < kT/q$, the above relationship is simplified according to:

$$J_L \approx \left(\frac{I_0 \cdot q}{n \cdot k \cdot T} + 1/R_{SH}\right) V = G_{pn} V \quad (2)$$

Where the conductance of the p-n junction, $G_{PN}$, is given by:

$$G_{pn} = \frac{I_0 \cdot q}{n \cdot k \cdot T} + 1/R_{SH} \quad (3)$$

It is recognized herein that measuring conductance of the p-n junction is particularly useful in determining the shunt resistance in structures with a high concentration of dislocations, such as, but not limited to, gallium nitride (GaN) LEDs or polycrystalline structures.

Under a steady-state and one-dimensional conditions, when low frequency modulated illumination or impulse illumination is utilized, and $V \gg kT/q$, the junction photovoltage may be determined by:

$$V = \frac{kTn}{q} \ln\left(\frac{J_L}{I_0}\right) \quad (4)$$

It has been shown that under local excitation of the lateral current of a p-n junction will lead to spreading of JPV and to a change of the JPV within the given illumination area. Such a relationship was found in V. Faifer et. al., *Proceedings of 24th ESSDERC* 1994, Edinburgh, p. 601 (1994); and V. N. Faifer et. al, *Appl. Phys. Let.*, 89, 151123 (2006), which are each incorporated herein by reference in the entirety. Taking into account the diode circuit, the steady-state JPV distribution v(x,y) under optical excitation may be described as:

$$\frac{\partial^2 v}{\partial x^2} + \frac{\partial^2 v}{\partial y^2} = R_S J_0\left(\exp\left(\frac{qv}{nkT}\right) - 1\right) - R_S J_L \quad (5)$$

where v(x,y) represents the junction photovoltage as function of x,y position, $J_L(x,y)$ represents the photocurrent density as a function of x,y position and $R_S$ is the sheet resistance of the upper layer of the p-n structure. For example, utilizing equation (1) above, the corresponding junction photovoltage curve as a function "r," as measured from the center of the illumination beam 104 corresponds to curve 144 in FIG. 1E, where, for example, $R_B$=3 cm, $R_S$=30 Ohm/sq and $J_L$=30 mA/cm$^2$.

In the example depicted in 1E, where v(R)=V for radius R<1 cm, the JPV corresponds to equation (4) above for both the first electrode 114 and the peripheral second electrode 134 at one-dimensional conditions.

Further, in the example where $R_{EL}$ and $R_2$ are both less than 1 cm (as in the example in FIG. 1E), the photovoltage signals $V_1$ captured by the first electrode 114 and the photovoltage signal $V_2$ captured by electrode 134 may be calculated using the following relationships:

$$V_1 = C_1 \int_0^{R_{EL}} 2\pi r v(r) dr = CV \quad (6)$$

$$V_2 = C_2 \int_{R_1}^{R_2} 2\pi r v(r) dr = C_{22} V \quad (7)$$

where C, $C_1$, $C_2$, $C_{22}$ are constants which may depend on the dielectric gap (e.g., air gap) between electrodes 114, 134 and the p-n junction 103, the gain of amplification of the preamplifiers 116 and 136 and other parameters. In one embodiment, the constants C and $C_{22}$ may be determined by applying an AC signal $V_0$ from the calibrated signal generator 128 to the chuck 125 through the electrical switch 126. In another embodiment, the electrical switch 126 may be electrically coupled to the edge contact pad 146, allowing an AC signal to be applied directly the n-layer of the semiconductor substrate 103. Further, constant C may be determined by measuring the voltages detected through electrode 114, amplifier 116 and/or demodulator 118, the output signal $V_{OUT1}$ and the formula $C = V_{OUT1}/V_0$. In addition, $C_{22}$ may be determined by measuring the voltages detected through electrode 134, amplifier 136 and/or demodulator 138, the output signal $V_{OUT2}$ and the formula $C_{22} = V_{OUT2}/V_0$.

In another embodiment, the saturation current density $I_0$ and ideality factor n may be determined using photovoltage signals $V_1$ and $V_2$ from electrode 114, under steady-state and one dimensional conditions, obtained at two different intensities $\Phi_1$ and $\Phi_2$ and photocurrent densities $J_{L1}$ and $J_{L2}$. For example, the following relationships relate the saturation current density and ideality factor to the photovoltage signals, the intensities and the photocurrent densities:

$$I_0 = J_{L1} \exp\left(-q\frac{V_1}{nkCT}\right) \quad (8)$$

$$n = q\frac{V_1 - V_2}{CkTln\left(\frac{J_{L1}}{J_{L2}}\right)} = q\frac{V_1 - V_2}{CkTln\left(\frac{\Phi_1}{\Phi_2}\right)} \quad (9)$$

It is noted herein that when determining the photocurrent density the wavelength of light 104 may be selected such that it is in the range of maximum collection efficiency, where $J_L = QE*q(1-R)\Phi$, where R represents reflectivity and QE represents the quantum efficiency. As such, $J_{L1}$ can be measured using a calibration p-n junction with electrodes connected to p- and n-junctions with similar reflectivity and at maximum collection efficiency in the wavelength range where $J_{L1} = QE*q(1-R)\Phi_1$.

In another embodiment, the photocurrent density is determined by measuring the junction photovoltage at light modulating frequencies leading to a non-steady-state condition in the measured JPV signal. In this regard, the controller 106 may cause the signal generator 110 to increase the light modulating frequency to a level necessary to achieve a non-steady-state condition in the JPV signal. It is noted herein that the high frequency photovoltage signal, $V_{hf}$, may be proportional to the intensity of the illumination and inversely proportional to light modulating frequency of the light. As such, the capacitance, $C_{pn}$, of the p-n junction may be related to the high frequency photovoltage by:

$$V_{hf} = \frac{J_L}{j2\pi f C_{pn}} \quad (10)$$

As such, the photocurrent density can be rewritten as:

$$J_L = 2\pi f C_{pn} V_{hf} \quad (11)$$

It is noted herein that the capacitance of the p-n junction $C_{pn}$ may be measured or calculated. In the case of p-i-n structures (e.g., GaN LED structures), where an active layer, i, is disposed between the p- and n-layers of the structure, the capacitance of the structure may be calculated by:

$$C_{pn} = \frac{\varepsilon_s \varepsilon_0}{d} \quad (12)$$

where d is the thickness of the i active layer, $\varepsilon_s$ is the dielectric constant of the active layer and $\varepsilon_0$ is the permittivity of free space.

In another embodiment, the capacitance $C_{pn}$ of the p-n junction 103 $C_{pn}$ may be determined using a measurement of the photocurrent density, $J_L$ and the following relationship:

$$C_{pn} = \frac{J_L}{j2\pi f V_{hf}} \quad (13)$$

For example, the photocurrent density $J_L$ may be measured, but is not required to be measured, using a photocurrent density probe (not shown) of system 100. In one embodiment, the photocurrent density probe of system 100 may include one or more contacts to the top layer of the p-n junction 103 within the illumination area 101. In addition, the bottom layer of the p-n junction 103 may be connected to a current meter (not shown) of the photocurrent density probe. In another embodiment, the photocurrent density probe may include a transparent electrode providing an electrical contact to the top surface of the p-n junction within illumination area.

Further, the value of $C_{pn}$ may be directly measured by system 100 via a capacitance probe (not shown). Further, utilizing the previously described equations, the controller 106 may determine the saturation current density using the following relationship:

$$I_0 = 2\pi f C_{pn} V_{hf1} \exp\left(-q\frac{V_1}{nCkT}\right) \quad (14)$$

In another embodiment, the photocurrent density is determined utilizing a derivative of the JPV signal. For example, the derivative of the JPV signal may be analyzed at the front edge of the transient response. For instance, the photocurrent density may be determined by analyzing the derivative of the JPV signal at the front edge of the transient response, such as shown in the JPV response 130 stimulated by the light pulse 131. In this regard, the following relationship relates the photocurrent density and the derivative of the JPV signal ($V_1$) measured at a first intensity:

$$J_L = C_{pn}\frac{dV_1}{dt} \quad (15)$$

In another embodiment, the controller 106 may generate one or more I-V curves utilizing any of the previously described methods for determining photocurrent density. In one embodiment, one or more I-V curves may be traced out by measuring a JPV signal at different intensities and modulation frequencies. In another embodiment, one or more I-V curves may be traced out by analyzing the transient JPV response to a ramped or triangular impulse light impulse from LED 108. It is noted herein that upon acquiring a given photocurrent density value the acquired photocurrent density value may be readily converted to a photocurrent value utilizing the applicable area.

It is noted herein that the system 100 is not limited to calculating the various characteristics of the p-n junction 103, as described previously herein, using the equations and relationships provided above. The various equations and relationships provided in the present disclosure are provided merely for illustrative purposes and should not be interpreted as limitations on the present disclosure. It is recognized herein that various relationships may be utilized by the controller 106 to relate two or more of the previously described quantities within the scope and spirit of the present invention.

Figure 2:
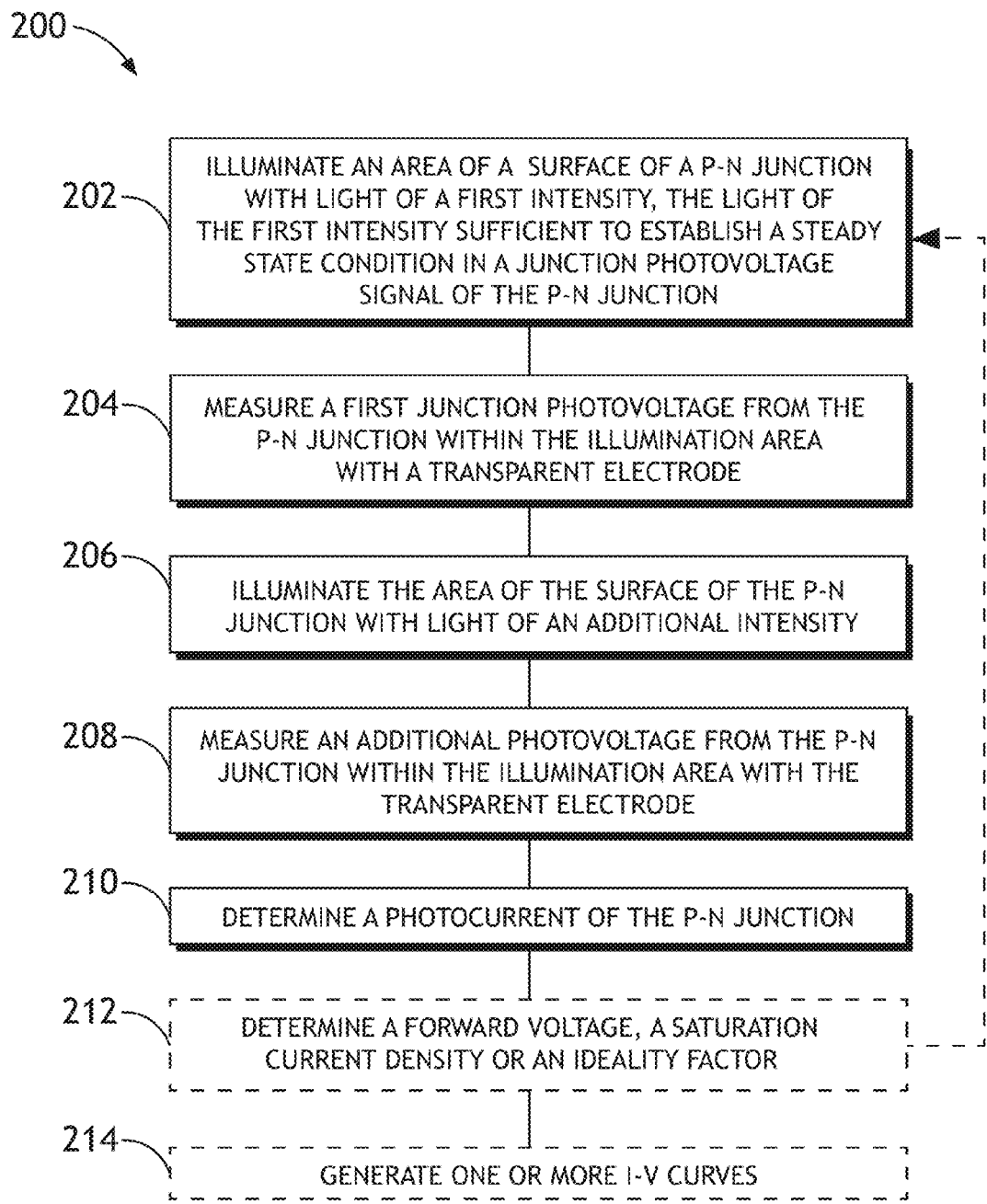
FIG. 2 is a flow diagram illustrating a method for contactless measurement of one or more characteristics of a p-n junction, in accordance with one embodiment of the present disclosure.

FIG. 2 illustrates a flow diagram depicting a method 200 for contactless measurement of one or more characteristics of a p-n junction, in accordance with one or more embodiments of the present disclosure. It is recognized herein that one or more of the steps of the method 200 may be implemented by one or more of the components and embodiments of system 100. It is noted, however, that method 200 is not limited to the structural limitations of system 100.

Step 202 illuminates an area of a surface of a p-n junction with light of a first intensity. In one embodiment, the light of the first intensity $\Phi_1$ has one or more time varying characteristics sufficient to establish a steady-state condition in a junction photovoltage signal of the p-n junction 103. For example, the light of the first intensity $\Phi_1$ may have a modulation frequency f low enough to establish a steady-state condition in the junction photovoltage of the p-n junction 103. In this regard, the modulation frequency may be adjusted by the controller 106 (or a user) until saturation in the JPV signal is reach during "on" phases of the stimulating light signal. By way of another example, the light of the first intensity $\Phi_1$ may include pulsed light having an intensity profile sufficient to establish a steady-state condition in the junction photovoltage of the p-n junction. In another embodiment, the illumination area 101 may be equal to the area of the glass plate 120. In another embodiment, the light of the first intensity $\Phi_1$ emitted by the LED 108 is transmitted through the glass plate 120 and the first transparent electrode 114 and then impinges on the front surface the p-n junction 103. In one embodiment, spectral range of the light of the first intensity may be selected such that it corresponds with a quantum efficiency in the p-n junction above a selected threshold (e.g., at or near maximum quantum efficiency). In one embodiment, spectral range of the light of the first intensity may be selected such that it overlaps with the spectral range displaying maximum spectral efficiency for the given p-n junction 103.

Step 204 measures a first junction photovoltage $V_1$ from the p-n junction 103 within the illumination area with a first transparent electrode 114. In another embodiment, the first junction photovoltage $V_1$ is measured with the first transparent electrode 114 and the preamplifier 116 and the demodulator/detector 118 of the first measurement element 112 of the measurement unit 104.

Step 206 illuminates the area of the surface of the p-n junction with light of an additional intensity (e.g., a second light intensity). In one embodiment, the light of the additional intensity $\Phi_2$ has one or more time varying characteristics sufficient to establish a steady-state condition in a junction photovoltage signal of the p-n junction 103. For example, the light of the additional intensity $\Phi_2$ may have a modulation frequency f low enough to establish a steady-state condition in the junction photovoltage of the p-n junction 103. Again, the modulation frequency may be adjusted by the controller 106 (or a user) until saturation in the JPV signal is reach during "on" phases of the stimulating light signal. By way of another example, the light of the additional intensity $\Phi_2$ may include pulsed light having an intensity profile sufficient to establish a steady-state condition in the junction photovoltage of the p-n junction 103. In another embodiment, the illumination area 101 may be equal to the area of the glass plate 120. In another embodiment, the light of the additional intensity $\Phi_2$ emitted by the LED 108 is transmitted through the glass plate 120 and the first transparent electrode 114 and then impinges on the front surface the p-n junction 103.

Step 208 measures an additional photovoltage $V_2$ (e.g., a second photovoltage) from the p-n junction 103 within the illumination area 101 with the first transparent electrode 114. In another embodiment, the additional junction photovoltage $V_2$ is measured with the first transparent electrode 114 and the preamplifier 116 and the demodulator/detector 118 of the first measurement element 112 of the measurement unit 104. It is noted herein that the steady-state photovoltages $V_1$ and $V_2$ may alternatively be measured utilizing a vibrating electrode in a Kelvin probe configuration. Such a configuration is described in additional detail further herein.

Step 210 determines a photocurrent density of the p-n junction 103. It is noted herein that the photocurrent density of step 210 may be determined in any manner described throughout the present disclosure.

In one embodiment, the photocurrent density of the p-n junction 103 at the first intensity $\Phi_1$ is determined by comparing an initial photocurrent density acquired with the transparent electrode 114 to a calibration photocurrent density acquired via one or more contact electrodes from a calibration p-n junction illuminated with light substantially similar to the light of the first intensity, as described previously herein.

In another embodiment, the photocurrent density of the p-n junction 103 at the first intensity $\Phi_1$ is determined by first illuminating the area of the surface of the p-n junction with light of the first intensity at a modulation frequency $f_{hf}$ sufficient to achieve non-steady-state conditions in the junction photovoltage of the p-n junction. In this regard, the controller 106 may direct the signal generator 110 to increase the modulation frequency to a frequency $f_{hf}$, where the corresponding JPV signal is inversely proportional to $f_{hf}$. Then, the first transparent electrode 114 may measure a high frequency junction photovoltage $V_{hf}$ from the p-n junction 103 within the illumination area 101 with the first transparent electrode 114. Further, the controller 106 may acquire a capacitance $C_{pn}$ of the p-n junction 103. For example, the system 100 may include one or more circuitry elements suitable for measuring the capacitance of the p-n junction 103. By way of another example, the capacitance of the p-n junction 103 may be calculated or estimated (e.g., see equation 12 previously herein). In addition, the photocurrent density of the p-n junction 103 at a modulation frequency sufficient to achieve non-steady-state conditions may be determined using the high frequency junction voltage $V_{hf}$, the capacitance $C_{pn}$ of the p-n junction 103 and the modulation frequency $f_{hf}$, as shown previously herein.

In another embodiment, the photocurrent density of the p-n junction 103 is determined by analyzing the derivative of the first junction photovoltage $V_1$ at a front edge of the first junction voltage $V_1$ transient response, as described previously herein.

Step 212 determines the forward voltage, saturation current density $I_0$ or the ideality factor n with the measured first photovoltage $V_1$, the measured additional photovoltage $V_2$ or the photocurrent density of the p-n junction 103. For example, the controller 106 may determine the forward voltage, saturation current density $I_0$ or the ideality factor n using the measured first photovoltage $V_1$, the measured additional photovoltage $V_2$ or the photocurrent density of the p-n junction 103, along with the various relationships (or equivalents thereof) described previously herein.

Step 214 generates one or more I-V curves. In one embodiment, the one or more I-V curves may be generated by acquiring a junction photovoltage and a corresponding photocurrent density at multiple illumination intensities and/or modulation frequencies. In this regard, steps 202-212 may be repeated in order to build up one or more I-V curves associated with a given p-n junction 103. For example, the controller 106 may utilize equation (11) (or an analogous relationship) described previously herein to construct one or more I-V by acquiring multiple photovoltages and corresponding photocurrents at multiple illumination intensities and/or frequencies.

Figure 3A:
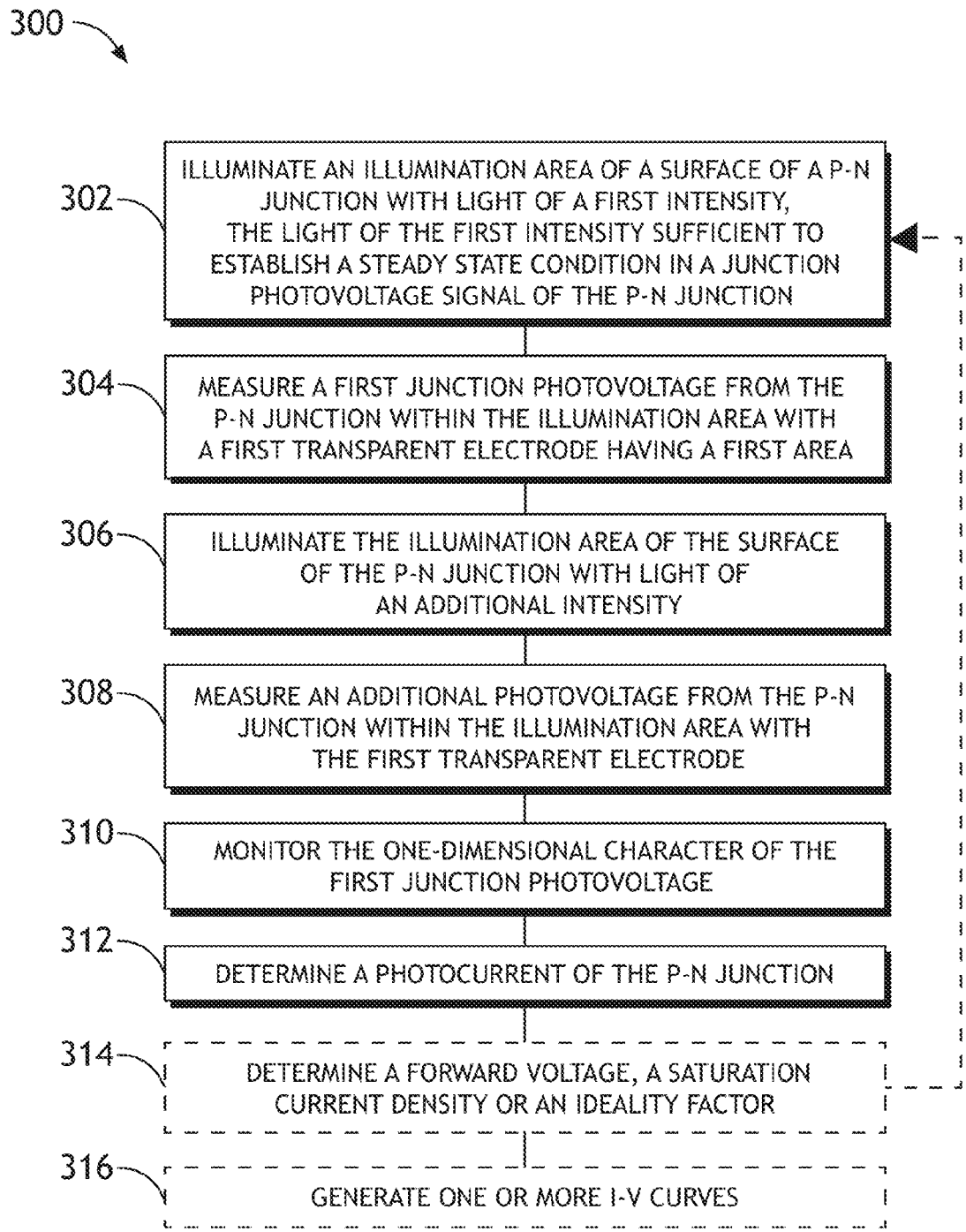
FIG. 3A-3B are flow diagrams illustrating a method for contactless measurement of one or more characteristics of a p-n junction, in accordance with one embodiment of the present disclosure.

FIG. 3A illustrates a flow diagram depicting a method 300 for contactless measurement of one or more characteristics of a p-n junction, in accordance with one or more embodiments of the present disclosure. It is noted herein that the various components, steps and embodiments described previously herein should be interpreted to extend to method 300 unless otherwise noted.

Step 302 illuminates an illumination area of a surface of a p-n junction with light of a first intensity $\Phi_1$. In one embodiment, the light of the first intensity $\Phi_1$ has one or more time varying characteristics sufficient to establish a steady-state condition in a junction photovoltage signal of the p-n junction 103, as described previously herein. Step 304 measures a first junction photovoltage $V_1$ from the p-n junction 103 within the illumination area with a first transparent electrode 114, as described previously herein. Step 306 illuminates the illumination area of the surface of the p-n junction 103 with light of an additional intensity $\Phi_2$, as described previously herein Step 308 measures an additional photovoltage $V_2$ (e.g., a second photovoltage) from the p-n junction 103 within the illumination area 101 with the first transparent electrode 114, as described previously herein.

Step 310 monitors the one dimensional character of the first junction photovoltage $V_1$ and/or the additional junction voltage $V_2$. In one embodiment, the one-dimensional character of the first junction photovoltage $V_1$ and/or the additional junction voltage $V_2$ is monitored with a second transparent electrode 134 positioned within the illumination area 101 and having a second area external to the first area of the first transparent electrode 114. In this regard, the second transparent electrode 134, in conjunction with the first transparent electrode 114, may monitor the one-dimensional condition, or characteristics, associated with a junction photovoltage signal of the p-n junction 103. In this regard, at a given intensity $\Phi_N$ of light emitted by the diode 108, the first transparent electrode 114 may measure a junction photovoltage $V_N$. In addition, at the same light intensity $\Phi_N$, the second transparent electrode 134 may measure a junction photovoltage $V_{NN}$. In this regard, the one dimensional nature of a given junction photovoltage may be monitored by comparing $V_N$ and $V_{NN}$ (e.g., calculating a ratio between $V_N$ and $V_{NN}$, calculating a difference between $V_N$ and $V_{NN}$ and the like). In this respect, the $V_{NN}$ signal is treated as a laterally extended portion of the first JPV signal $V_N$ stimulated by the illumination of the Nth intensity $\Phi_N$.

In one embodiment, the one-dimensional character, or condition, of the first junction photovoltage is monitored by measuring a junction photovoltage $V_{11}$ from a portion of the p-n junction 103 within the illumination area 101 illuminated with light of the first intensity $\Phi_1$ with the second transparent electrode 134. Then, the junction photovoltage $V_{11}$ (measured with the second electrode 134 at intensity $\Phi_1$) may be compared to the first junction photovoltage (measured with the first electrode 114 at intensity $\Phi_1$). In this regard, the one-dimensional nature of the first junction photovoltage may be monitored by comparing $V_1$ and $V_{11}$.

For example, the controller 106 may calculate a ratio between $V_1$ and $V_{11}$, calculate a difference between $V_1$ and $V_{11}$ or the like. In this respect, the $V_{11}$ signal is treated as a laterally extended portion of the first JPV signal $V_1$ stimulated by the illumination of the first intensity I.

In another embodiment, the one-dimensional character, or condition, of the additional junction photovoltage $V_2$ is monitored by measuring a junction photovoltage $V_{22}$ from a portion of the p-n junction 103 within the illumination area 101 illuminated with light of the additional intensity $\Phi_2$ with the second transparent electrode 134. Then, the junction photovoltage $V_{22}$ (measured with the second electrode 134 at intensity $\Phi_2$) may be compared to the additional junction photovoltage $V_2$ (measured with the first electrode 114 at intensity $\Phi_2$). In this regard, the one-dimensional nature of the additional junction photovoltage may be monitored by comparing $V_2$ and $V_{22}$. For example, the controller 106 may calculate a ratio between $V_2$ and $V_{22}$, calculate a difference between $V_2$ and $V_{22}$ or the like. In this respect, the $V_{22}$ signal is treated as a laterally extended portion of the first JPV signal $V_2$ stimulated by the illumination of the first intensity $\Phi_2$.

It is further noted herein that this procedure may be repeated at various intensities, wavelengths and modulation frequencies. It is further noted that the sub-steps described with respect to Step 310 are not limited to additional steps of method 300 and may be implemented independently of the additional steps of method 300, allowing the system 100 to monitor the one-dimensional nature of the JPV signal in any context.

Step 312 determines a photocurrent density of the p-n junction. It is noted herein that the step 312 of determining a photocurrent density of the p-n junction 103 may be accomplished in any manner described throughout the present disclosure.

Figure 3B:
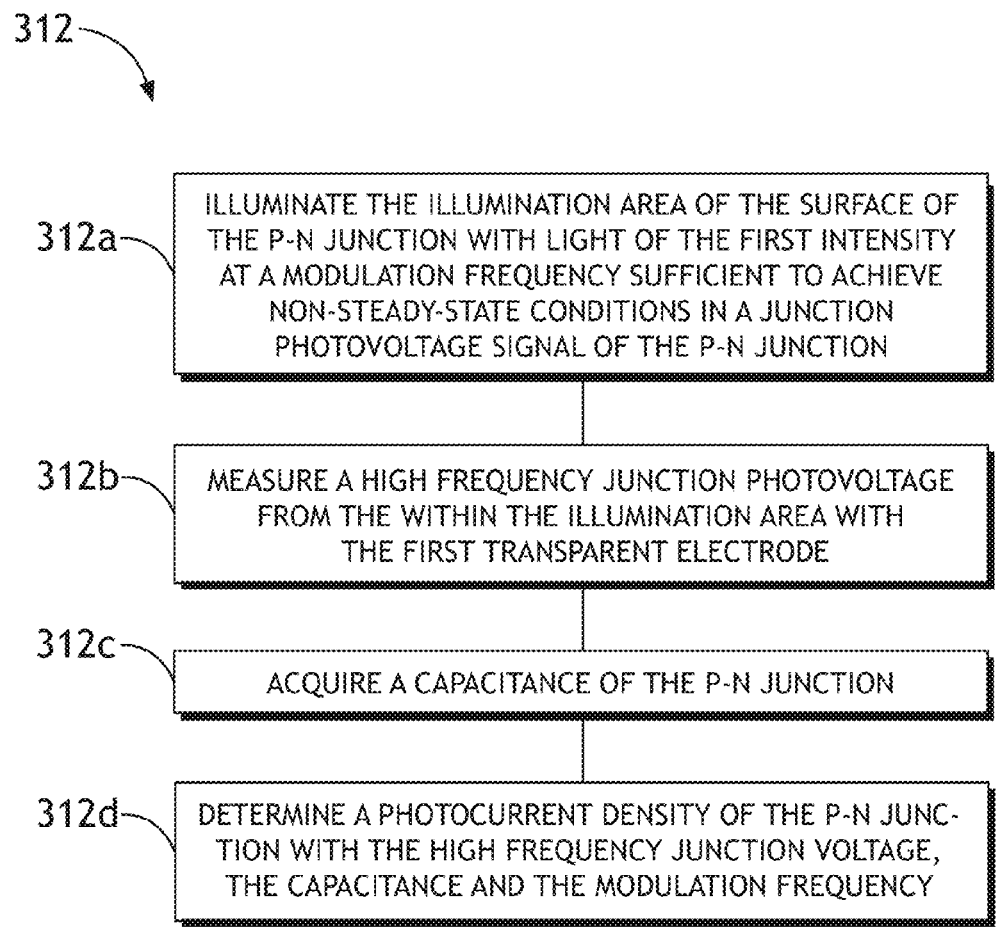

For example, as shown in FIG. 3B, the step 312 of determining a photocurrent density of the p-n junction 103 includes sub-steps 312a-312d. Sub-step 312a illuminates the illumination area 101 of the surface of the p-n junction 103 with light of the first intensity $\Phi_1$ at a modulation frequency $f_{hf}$ sufficient to achieve non-steady-state conditions in a junction photovoltage signal of the p-n junction 103. For example, as described previously herein, the illumination unit 102 illuminates the area of the surface of the p-n junction 103 with light of the first intensity $\Phi_1$ at a modulation frequency $f_{hf}$ sufficient to achieve non-steady-state conditions in the junction photovoltage of the p-n junction 103. In this regard, the controller 106 may direct the signal generator 110 to increase the modulation frequency to a frequency $f_{hf}$, where the corresponding JPV signal is inversely proportional to $f_{hf}$.

Sub-step 312b measures a high frequency junction photovoltage $V_{hf}$ from the within the illumination area 101 with the first transparent electrode 114. For example, the first transparent electrode 114 and corresponding signal processing circuitry (e.g., preamplifier 116 and/or demodulator/detector 118) may measure a high frequency junction photovoltage $V_{hf}$ from the p-n junction 103 within the illumination area 101.

Sub-step 312c acquires a capacitance of the p-n junction. In one embodiment, the controller 106 may acquire a capacitance $C_{pn}$ of the p-n junction 103. For example, the system 100 may include one or more circuitry elements suitable for measuring the capacitance of the p-n junction 103. For instance, these circuitry elements may include an independent capacitance probed used to measure the capacitance associated with the p-n interface of the p-n junction. By way of another example, the capacitance of the p-n junction 103 may be calculated or estimated (e.g., see equation 12 previously herein) by the controller 106. By way of another example, the controller 106 may receive a capacitance value for the p-n junction from a user or from an addition measurement tool or system.

Sub-step 312d determines a photocurrent density of the p-n junction 103 with the high frequency junction voltage $V_{hf}$, the capacitance $C_{pn}$ of the p-n junction 103 and the modulation frequency $f_{hf}$. For example, the controller 106 may calculate one or more photocurrent density values based on the measured or acquired values of the high frequency junction voltage $V_{hf}$, the capacitance $C_{pn}$ of the p-n junction 103 and the modulation frequency $f_{hf}$, and equation (11) described previously herein.

In another embodiment, the photocurrent density of the p-n junction 103 at the first intensity $\Phi_1$ may be determined by comparing an initial photocurrent density acquired with the transparent electrode 114 to a calibration photocurrent density acquired via one or more contact electrodes from a calibration p-n junction illuminated with light substantially similar to the light of the first intensity, as described previously herein.

In another embodiment, the photocurrent density of the p-n junction 103 may be determined by analyzing the derivative of the first junction photovoltage $V_1$ at a front edge of the first junction voltage $V_1$ transient response, as described previously herein.

Step 314 determines the forward voltage, saturation current density $I_0$ or the ideality factor n with the measured first photovoltage $V_1$, the measured additional photovoltage $V_2$ or the photocurrent density of the p-n junction 103. For example, the controller 106 may determine the forward voltage, saturation current density $I_0$ or the ideality factor n using the measured first photovoltage $V_1$, the measured additional photovoltage $V_2$ or the photocurrent density of the p-n junction 103, along with the various relationships (or equivalents thereof) described previously herein.

Step 316 generates one or more I-V curves. In one embodiment, the one or more I-V curves are generated by acquiring a junction photovoltage and a corresponding photocurrent at multiple illumination intensities and/or modulation frequencies. In this regard, steps 302-314 may be repeated in order to build up one or more I-V curves associated with a given p-n junction 103. For example, the controller 106 may utilize equation (11) (or an analogous relationship) described previously herein to construct one or more I-V curves by acquiring multiple photovoltages $V_1$-$V_N$ and corresponding photocurrent densities $J_1$-$J_N$ at multiple illumination intensities $\Phi_1$-$\Phi_N$ and/or modulation frequencies $f_1$-$f_N$.

Figure 4:
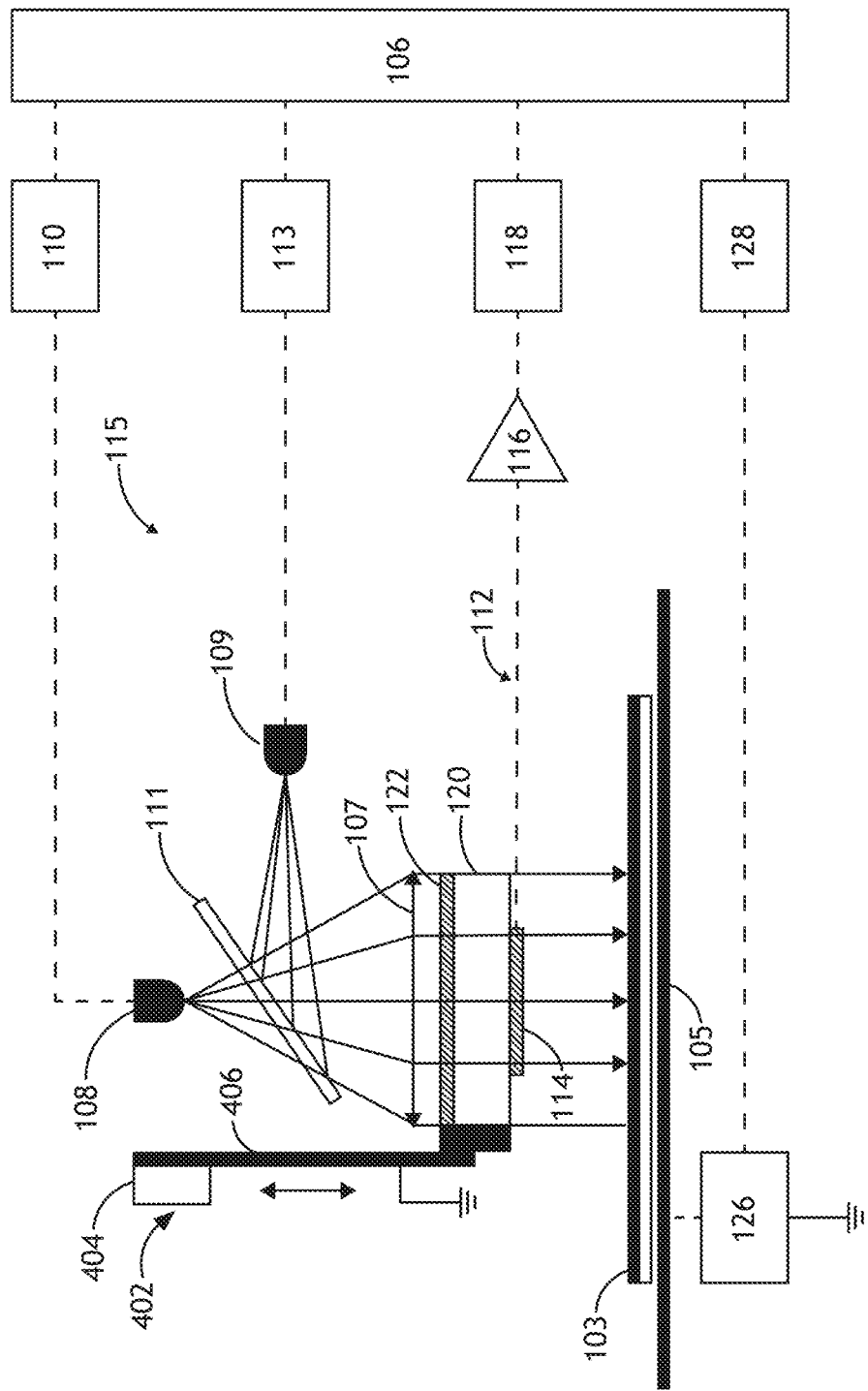
FIG. 4 is a block diagram illustrating an apparatus for contactless measurement of one or more characteristics of a p-n junction configured to perform surface potential measurements via the vibration of a transparent electrode, in accordance with one embodiment of the present disclosure.

Referring now to FIG. 4, a Kelvin probe unit 402 of system 100 is depicted, in accordance with one or more embodiments of the present invention. It is noted herein that the various components, steps and embodiments described previously herein should be interpreted to extend to the embodiment of system 100 in FIG. 4 unless otherwise noted. It is noted herein that the Kelvin probe configuration of FIG. 4 may be utilized to measure the steady-state junction photovoltages based on a differential surface potential measurement through the measurement of the contact potential difference (CPD) under dark and steady-state illumination conditions. In this regard, the forward voltage of the p-n junction 103 may be calculated. It is noted herein that for the purposes of this description the forward voltage is equivalent or nearly equivalent to a first junction voltage $V_1$ or an additional junction voltage $V_2$, which can be written as:

$$V_1 = CPD_{\varphi 1} - CPD_{dark} \qquad (15)$$

$$V_2 = CPD_{\varphi 2} - CPD_{dark} \qquad (16)$$

where $CPD_{\varphi 1}$ and $CPD_{\varphi 2}$ represent the CPD obtained at the first light intensity $\Phi_1$ and the additional light intensity $\Phi_2$ respectively and $CPD_{dark}$ represents the CPD obtained under dark or near dark illumination conditions.

In one embodiment, the probe unit 402 includes a vibrating element 404 (e.g., vibrator) and a coupling element 406 (e.g., rod). In one embodiment, the transparent element 120 (e.g., one or more glass plates) is mechanically coupled to the coupling element 406, allowing the vibrating element 404 to mechanically drive the motion of the transparent element 120 and thus the first electrode 114 and/or the second electrode 134. In another embodiment, the vibrating element 404 is communicatively coupled to the controller 106. In this regard, the controller 106 may direct the vibrating element 404 to drive the mechanical motion of the glass element 120 and the electrodes 114 and/or 134 at a selected amplitude and/or frequency. It is noted herein that while FIG. 4 depicts system 100 with only the first electrode 114 and not the outer second electrode 134 this should not be interpreted as limitation on the implementation of the Kelvin probe techniques described herein. It is noted herein that the Kelvin probed unit 402 may be configured to operate with a single electrode 114 or with the first transparent electrode 114 and the second transparent outer electrode 134.

Kelvin probe techniques utilized generally in the context of transparent electrodes are described generally in U.S. Pat. No. 5,216,362 to Verkuil, issued on Jun. 1, 1993, which is incorporated above by reference in the entirety.

In one embodiment, the vibrating electrode 114 may measure a first junction photovoltage $V_1$ from the portion of the p-n junction 103 within the illumination area 101 by determining the CPD for the p-n junction 103 under both dark illumination and an illumination of a first intensity $\Phi_1$. In one embodiment, the controller 106 may determine a difference between a first surface potential measured under dark conditions (i.e. zero or near zero illumination) and an additional surface potential measured under the light of the first intensity $\Phi_1$ from the LED 108. For example, the system 100 may establish a dark illumination condition (e.g., zero or near zero illumination). Then, the vibrating electrode 114 (and the rest of measurement unit 102) may measure the surface potential of the p-n junction 103 under the dark illumination conditions. Further, the illumination unit 102 may illuminate the p-n junction 103 with light of the first intensity $\Phi_1$. In turn, the vibrating electrode 114 (and the rest of measurement unit 102) may measure the surface potential of the p-n junction 103 with light of the first intensity $\Phi_1$ impinging on the p-n junction 103. In addition, the controller 106 (e.g., one or more processors of the controller 106) may calculate a difference between the surface potential at the first light intensity and the surface potential under dark illumination conditions to find a first photovoltage $V_1$ (equivalent to the forward voltage).

In another embodiment, the vibrating electrode 114 may measure an additional photovoltage $V_2$ from the portion of the p-n junction 103 within the illumination area 101 by determining the CPD for the p-n junction 103 under dark illumination and an illumination the additional intensity $\Phi_2$. In one embodiment, the controller 106 may calculate a difference between a first surface potential measured under dark conditions (i.e. zero or near zero illumination) and an additional surface potential measured under the light of the additional intensity $\Phi_2$ from the LED 108. For example, the system 100 may establish a dark illumination condition Then, the vibrating electrode 114 (and the rest of measurement unit 102) may measure the surface potential of the p-n junction 103 under the dark illumination conditions (or re-use the result of the dark illumination condition described above). Further, the illumination unit 102 may illuminate the p-n junction with light of the additional intensity $\Phi_2$. In turn, the vibrating electrode 114 (and the rest of measurement unit 102) may measure the surface potential of the p-n junction 103 with light of the additional intensity $\Phi_2$ impinging on the p-n junction 103. In addition, the controller 106 (e.g., one or more processors of the controller 106) may calculate a difference between the surface potential at the additional light intensity and the surface potential under dark illumination conditions to find a first photovoltage $V_2$ (equivalent to the forward voltage).

In another embodiment, the one-dimensional condition, or character, of the first junction photovoltage $V_1$ or the additional photovoltage $V_2$ may be monitored via the second vibrating transparent electrode 134. In this regard, the junction photovoltages $V_{11}$ and/or $V_{22}$ can be determined via the surface potential differential technique described above. In turn, the junction photovoltages $V_{11}$ and/or $V_{22}$ acquired with the second vibrating transparent electrode 134 may be compared (e.g., calculating a ratio, calculating a difference and the like) to the JPV signals $V_1$ and $V_2$, acquired with the first vibrating transparent electrode 114, respectively to monitor the one-dimensional nature of the JPV signal. It is noted herein that the comparison between $V_1/V_{11}$ and/or $V_2/V_{22}$ is similar to that described previously herein.

The photocurrent density $J_L$ may be measured in any manner described throughout the present disclosure. For example, the photocurrent density $J_L$ may be measured utilizing the calibrated p-n junction technique or the non-steady-state JPV measurement technique, each of which are described throughout the present disclosure.

In another embodiment, the photocurrent density $J_L$ may be determined utilizing a derivative of the JPV signal measured with the vibrating electrode 114. For example, the derivative of the JPV signal may be analyzed at the front edge of the transient response. In this regard, the JPV response measured by the Kelvin probe technique and stimulated by a light pulse may be analyzed. For example, the derivative of the JPV signal ($V_1$) measured at a first intensity may be used to calculate the photocurrent density $J_L$ much in the same way as previously described with respect to equation (15).

Figure 5:
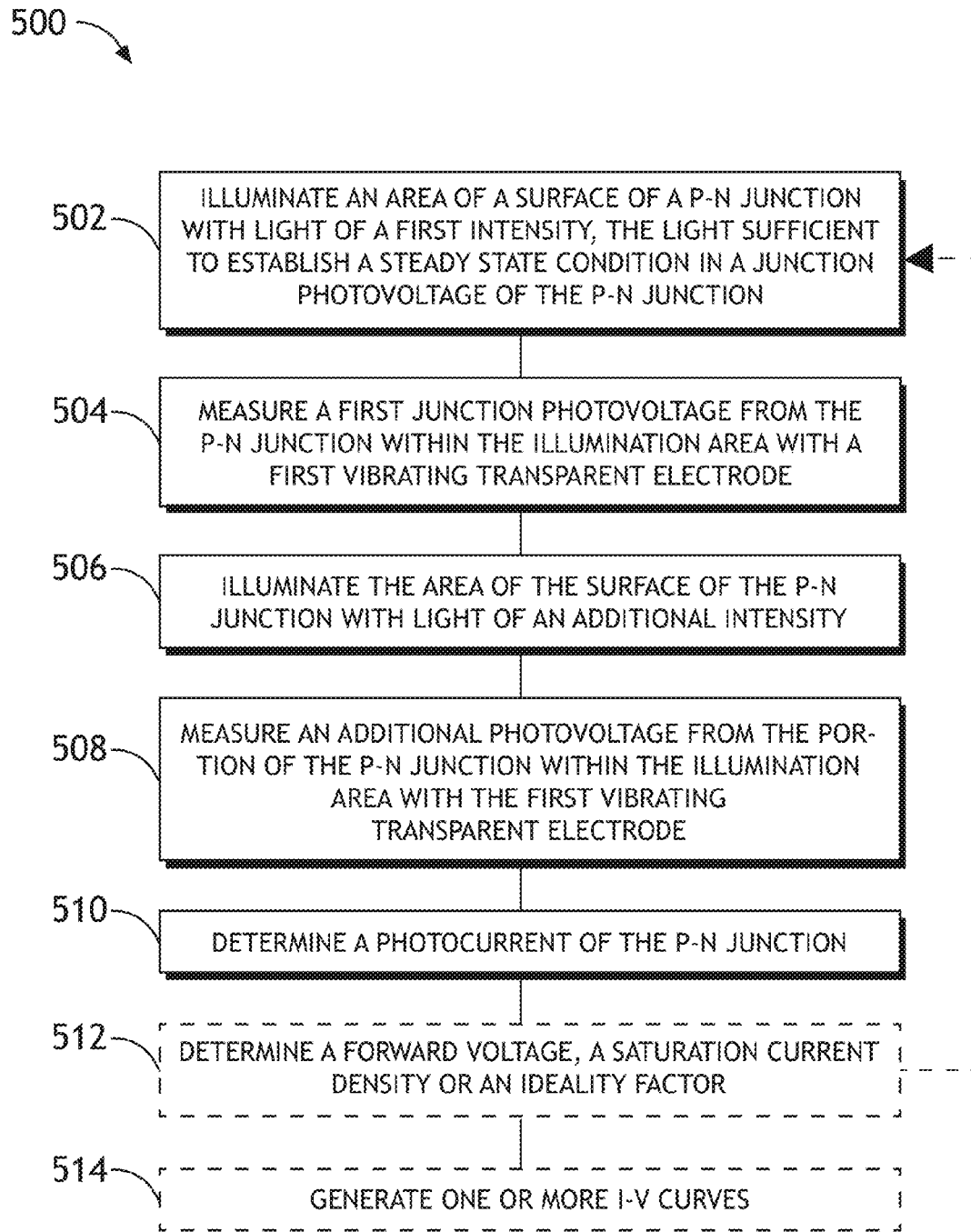
FIG. 5 is a flow diagram illustrating a method for contactless measurement of one or more characteristics of a p-n junction, in accordance with one embodiment of the present disclosure.

FIG. 5 illustrates a flow diagram depicting a method 500 for contactless measurement of one or more characteristics of a p-n junction, in accordance with one or more embodiments of the present disclosure. It is noted herein that the various components, steps and embodiments described previously herein should be interpreted to extend to the method 500 unless otherwise noted. It is noted herein that method 500 may be carried out utilizing the Kelvin probe configuration of FIG. 4, however method 500 is not limited to the structural limitations depicted in FIG. 4.

Step 502 illuminates an illumination area of a surface of a p-n junction with light of a first intensity $\Phi_1$ having one or more time varying characteristics sufficient to establish a steady-state condition in a junction photovoltage signal of the p-n junction 103, as described previously herein.

Step 504 measures a first junction photovoltage $V_1$ from a portion of the p-n junction 103 within the illumination area 101 with a first vibrating transparent electrode 114. In one embodiment, the first junction photovoltage $V_1$ is measured by determining a difference between a first surface potential measured during a dark illumination condition (e.g., zero illumination or near zero illumination) an additional surface measured during illumination of the light of the first intensity $\Phi_1$ in a steady-state condition with the first vibrating transparent electrode 114. In one embodiment, the vibrating electrode 114 may measure a first junction photovoltage $V_1$ from the portion of the p-n junction 103 within the illumination area 101 by determining the CPD for the p-n junction 103 under both dark illumination and an illumination of the first intensity $\Phi_1$. For example, the controller 106 may determine a difference between a first surface potential measured under dark conditions and an additional surface potential measured under at the first intensity $\Phi_1$. In this regard, the controller 106 (e.g., one or more processors of the controller 106) may calculate a difference between the surface potential at the first light intensity $\Phi_1$ and the surface potential under dark illumination conditions to find a first photovoltage $V_1$.

Step 506 illuminates an illumination area of a surface of a p-n junction with light of an additional intensity $\Phi_2$ having one or more time varying characteristics sufficient to establish a steady-state condition in a junction photovoltage signal of the p-n junction 103, as described previously herein.

Step 508 measures an additional junction photovoltage $V_2$ from a portion of the p-n junction 103 within the illumination area 101 with the first vibrating transparent electrode 114. In one embodiment, the additional junction photovoltage $V_1$ is measured by determining a difference between a first surface potential measured during a dark illumination condition (e.g., zero illumination or near zero illumination) and an additional surface potential measured during illumination of the light of the additional intensity $\Phi_2$ in a steady-state condition with the first vibrating transparent electrode 114. In one embodiment, the vibrating electrode 114 may measure an additional junction photovoltage $V_2$ from the portion of the p-n junction 103 within the illumination area 101 by determining the CPD for the p-n junction 103 under both dark illumination and an illumination of the additional intensity $\Phi_2$. For example, the controller 106 may determine a difference between a first surface potential measured under dark conditions and an additional surface potential measured under at the additional intensity $\Phi_2$. In this regard, the controller 106 may calculate a difference between the surface potential at the additional light intensity $\Phi_2$ and the surface potential under dark illumination conditions to find the additional photovoltage $V_2$.

Step 510 determines a photocurrent density of the p-n junction 103 at the first intensity (or the additional intensity). It is noted herein that the step 510 of determining a photocurrent density of the p-n junction 103 may be accomplished in any manner described throughout the present disclosure. For example, the method 500 may illuminate the illumination area 101 of the surface of the p-n junction 103 with light of the first intensity at a modulation frequency $f_{hf}$ sufficient to achieve non-steady-state conditions in a junction photovoltage signal of the p-n junction 103. In this regard, the controller 106 may direct the signal generator 110 to increase the modulation frequency to a frequency $f_{hf}$, where the corresponding JPV signal is inversely proportional to $f_{hf}$. In another embodiment, the method 500 includes measuring a high frequency junction photovoltage $V_{hf}$ from the portion of the p-n junction within the illumination area 101 using the first vibrating transparent electrode 114. For example, the first vibrating transparent electrode 114 and corresponding signal processing circuitry (e.g., preamplifier 116 and/or demodulator/detector 118) may measure a high frequency junction photovoltage $V_{hf}$ from the p-n junction 103 within the illumination area 101. In another embodiment, the method 500 includes acquiring a capacitance of the p-n junction 103. For example, the capacitance $C_{pn}$ of the p-n junction 103 may be acquired in any manner described throughout the present disclosure, such as, but not limited to, independent measurement, calculation or user-entry.

In another embodiment, method 500 includes determining the photocurrent density of the p-n junction 103 with the high frequency junction voltage $V_{hf}$ obtained with the first vibrating electrode 114, the capacitance $C_{pn}$ of the p-n junction 103 and the modulation frequency $f_{hf}$. For example, the controller 106 may calculate one or more photocurrent density values based on the measured or acquired values of the high frequency junction voltage $V_{hf}$, the capacitance $C_{pn}$ of the p-n junction 103 and the modulation frequency $f_{hf}$, and equation (11) described previously herein.

In another embodiment, the photocurrent density of the p-n junction 103 at the first intensity $\Phi_1$ may be determined by comparing an initial photocurrent density acquired with the transparent electrode 114 to a calibration photocurrent density acquired via one or more contact electrodes from a calibration p-n junction illuminated with light substantially similar to the light of the first intensity, as described previously herein.

Step 512 determines the forward voltage, saturation current density $I_0$ or the ideality factor n with the measured first photovoltage $V_1$, the measured additional photovoltage $V_2$ or the photocurrent density of the p-n junction 103. For example, the controller 106 may determine the forward voltage, saturation current density $I_0$ or the ideality factor n using the measured first photovoltage $V_1$, the measured additional photovoltage $V_2$ or the photocurrent density of the p-n junction 103, along with the various relationships (or equivalents thereof) described previously herein.

Step 514 generates one or more I-V curves. In one embodiment, the one or more I-V curves are generated by acquiring a junction photovoltage and a corresponding photocurrent density at multiple illumination intensities and/or modulation frequencies. In this regard, steps 502-512 may be repeated in order to build up one or more I-V curves associated with a given p-n junction 103. For example, the controller 106 may utilize equation (11) (or an analogous relationship) described previously herein to construct one or more I-V curves by acquiring multiple photovoltages $V_1$-$V_N$ and corresponding photocurrent densities $J_1$-$J_N$ at multiple illumination intensities $\Phi_1$-$\Phi_N$ and/or modulation frequencies $f_1$-$f_N$.

In another embodiment, the method 500 may monitor the one dimensional character of the first junction photovoltage $V_1$ and/or the additional junction voltage $V_2$ with a second vibrating transparent electrode 134 positioned within the illumination area 101, as described previously herein. In this regard, the second vibrating transparent electrode 134, in conjunction with the first vibrating transparent electrode 114, may monitor the one-dimensional condition, or characteristic, associated with a junction photovoltage signal of the p-n junction 103. In this regard, at a given intensity $\Phi_N$, the first vibrating transparent electrode 114 may measure a junction photovoltage $V_N$. In addition, at the same light intensity $\Phi_N$, the second vibrating transparent electrode 134 may measure a junction photovoltage $V_{NN}$. In this regard, the one dimensional nature of a given junction photovoltage may be monitored by comparing $V_N$ and $V_{NN}$ (e.g., calculating a ratio between $V_N$ and $V_{NN}$, calculating a difference between $V_N$ and $V_{NN}$ and the like). As previously noted herein, the $V_{NN}$ signal is treated as a laterally extended portion of the first JPV signal $V_N$ stimulated by the illumination of the Nth intensity $\Phi_N$.

It is further recognized that the controller 106 may execute one or more steps of any of the various methods described throughout the present disclosure. In this regard, the methods disclosed may be implemented as a set of program instructions. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented In one embodiment, the controller 106 includes one or more processors and memory (e.g., non-transitory memory). The one or more processors of controller 106 may include any one or more processing elements known in the art. In general, the term "processor" may be broadly defined to encompass any device having one or more processing elements, which execute program instructions from a non-transitory memory medium. The one or more processors may include any microprocessor-type device configured to execute software algorithms and/or program instructions. In one embodiment, the one or more processors may include any one of a desktop computer, mainframe computer system, workstation, image computer, parallel processor, or other computer system (e.g., networked computer) configured to execute a set of program instructions configured to operate the system 100, as described throughout the present disclosure. It should be recognized that the steps described throughout the present disclosure may be carried out by a single controller or, alternatively, multiple controllers. The memory may include any storage medium known in the art suitable for storing program instructions executable by the associated one or more processors of controller 106. For example, the memory may include, but is not limited to, a read-only memory, a random access memory, a magnetic or optical memory device (e.g., disk), a magnetic tape, a solid state drive and the like. In another embodiment, it is noted herein that the memory is configured to store one or more results from the one or more of the various sub-systems of system 100. In another embodiment, the memory may be located remotely with respect to the physical location of the processors and controller 106. For instance, the one or more processors of controller 106 may access a remote memory (e.g., server), accessible through a network (e.g., internet, intranet and the like).

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

It is further contemplated that each of the embodiments of the method described above may include any other step(s) of any other method(s) described herein. In addition, each of the embodiments of the method described above may be performed by any of the systems described herein.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An apparatus for contactless measurement of one or more characteristics of a p-n junction comprising:
    an illumination unit for illuminating a surface of a p-n junction with light at one or more selected intensities and one or more selected frequencies;
    a measurement unit including at least a first measurement element including a first transparent electrode positioned proximate to the p-n junction and configured to transmit light from the illumination unit to the surface of the p-n junction, wherein the first transparent electrode has a first area for measuring a junction photovoltage of the p-n junction corresponding with the first area within the illuminated area, wherein the first area of the first electrode is smaller than the area illuminated by the illumination unit in order to limit an effect of lateral spreading of the junction photovoltage on the measurement of the junction photovoltage; and
    a controller communicatively coupled to at least the measurement unit and the illumination unit, the controller configured to:
    control at least one of light intensity or frequency of the light from the illumination unit;
    receive one or more measurements of the junction photovoltage from the measurement unit at the one or more selected light intensities and one or more selected frequencies; and
    determine at least one of a photocurrent density of the p-n junction, a forward voltage of the p-n junction, a saturation current density of the p-n junction, an ideality factor of the p-n junction or one or more I-V curves of the p-n junction with the one or more measurements of the junction photovoltage received from the measurement unit.

2. The apparatus of claim 1, wherein the light at one or more selected intensities and one or more selected frequencies includes:
    at least one of modulated light modulated at a modulation frequency sufficient to establish a steady-state within the junction photovoltage.

3. The apparatus of claim 1, wherein the light at one or more selected intensities and one or more selected frequencies includes:
    pulsed light of a selected magnitude and pulse duration.

4. The apparatus of claim 1, wherein the light at one or more selected intensities and one or more selected frequencies includes:
    at least one of modulated light modulated at modulation frequency sufficient to establish a non-steady-state within the junction photovoltage.

5. The apparatus of claim 4, wherein the controller is further configured to:
    determine a photocurrent density using the modulation frequency, a measured high frequency junction photovoltage of the p-n junction, and a capacitance of the p-n junction.

6. The apparatus of claim 1, wherein the measurement unit further includes:
    a second measurement element including a second electrode having a second area, the second electrode positioned within the illumination area and outside of the first area of the first electrode.

7. The apparatus of claim 6, wherein the second electrode and the first electrode are configured to monitor a one-dimensional condition of the junction photovoltage.

8. The apparatus of claim 6, wherein at least one of the first measurement element or the second measurement element of the measurement sub-system further includes:
    one or more signal processing elements.

9. The apparatus of claim 8, wherein the one or more signal processing elements comprise:
    at least one a preamplifier, demodulator or detector.

10. The apparatus of claim 1, wherein the p-n junction comprises:
    at least one of a homojunction based p-n junction and a heterojunction based p-n junction.

11. The apparatus of claim 1, further comprising:
    a grounded top transparent electrode configured to shield at least the first transparent electrode.

12. The apparatus of claim 1, further comprising:
    a transparent element configured to secure at least the first transparent electrode and a second transparent electrode positioned outside of the first transparent electrode.

13. The apparatus of claim 12, further comprising:
    a vibrating element coupled to the transparent element, wherein the vibrating element is configured to mechanically drive the motion of at least the first transparent electrode.

14. The apparatus of claim 13, wherein the controller is configured to measure one or more junction photovoltage values by calculating a difference between a first surface potential measured with the first transparent electrode during a dark illumination condition and an additional surface potential measured with the first transparent electrode during illumination of light of a first intensity in a steady-state condition.

15. A method for contactless measurement of one or more characteristics of a p-n junction comprising:
   illuminating an illumination area of a surface of a p-n junction with light of a first intensity, wherein the modulation of light of the first intensity is sufficient to establish a steady-state condition in a junction photovoltage of the p-n junction;
   measuring a first junction photovoltage from a portion of the p-n junction within the illumination area illuminated by the light of the first intensity with a transparent electrode positioned within the illumination area and proximate to the surface of the p-n junction, wherein the first area of the first electrode is smaller than the illuminated area in order to limit an effect of lateral spreading of the junction photovoltage on the measurement of the junction photovoltage;
   illuminating the area of the surface of the p-n junction with light of an additional intensity different from the light of the first intensity, wherein the light of the additional intensity is sufficient to establish a steady-state condition in a junction photovoltage of the p-n junction;
   measuring an additional photovoltage from the portion of the p-n junction within the illumination area illuminated by the light of the additional intensity with the transparent electrode; and
   determining at least one of a photocurrent density of the p-n junction, a forward voltage of the p-n junction, a saturation current density of the p-n junction, an ideality factor of the p-n junction or one or more I-V curves of the p-n junction with at least one of the junction photovoltage or the additional junction photovoltage.

16. The method of claim 15, wherein at least one of the light of the first intensity or the light of the additional intensity comprises:
   intensity modulated light having a modulation frequency low enough to establish a steady-state condition in the junction photovoltage of the p-n junction.

17. The method of claim 15, wherein at least one of the light of the first intensity or the light of the additional intensity comprises:
   pulsed light having an intensity profile sufficient to establish a steady-state condition in the junction photovoltage of the p-n junction.

18. The method of claim 15, wherein the first surface of the p-n junction comprises:
   a front surface of the p-n junction.

19. The method of claim 15, wherein the p-n junction comprises:
   at least one of a homojunction based p-n junction and a heterojunction based p-n junction.

20. The method of claim 15, wherein at least one of the light of the first intensity or light of the additional intensity has a spectral range including a wavelength or wavelength range corresponding to a quantum efficiency in the p-n junction above a selected threshold.

21. The method of claim 15, wherein the photocurrent density of the p-n junction is determined by comparing an initial photocurrent density acquired with the transparent electrode to a calibration photocurrent density acquired via one or more contact electrodes from a calibration p-n junction illuminated with light substantially similar to the light of the first intensity.

22. The method of claim 21, wherein the junction photovoltage and the additional junction photovoltage are measured with p and n layers of the p-n junction electrically coupled.

23. The method of claim 21, further comprising:
   comparing at least one of the first photovoltage or the additional photovoltage to one or more junction voltage signals measured from the area and induced by an alternating voltage applied to the p-n junction.

24. The method of claim 15, wherein the photocurrent density of the p-n junction is determined by:
   illuminating the area of the surface of the p-n junction with light of the first intensity at a modulation frequency sufficient to achieve non-steady-state conditions in the junction photovoltage of the p-n junction;
   measuring a high frequency junction photovoltage from the portion of the p-n junction within the illumination area with the transparent electrode;
   acquiring a capacitance of the p-n junction; and
   determining a photocurrent density of the p-n junction at the modulation frequency sufficient to achieve non-steady-state conditions in the junction photovoltage of the p-n junction with the high frequency junction voltage, the capacitance of the p-n junction and the modulation frequency.

25. The method of claim 15, wherein the photocurrent density of the p-n junction is determined by analyzing the derivative of the first junction photovoltage at a front edge of the first junction voltage transient response.

26. A method for contactless measurement of one or more characteristics of a p-n junction comprising:
   illuminating an illumination area of a surface of a p-n junction with light of a first intensity, wherein the light of the first intensity is sufficient to establish a steady-state condition in a junction photovoltage of the p-n junction;
   measuring a first junction photovoltage from a portion of the p-n junction within the illumination area illuminated by the light of the first intensity with a first transparent electrode having a first area and positioned within the illumination area and proximate to the surface of the p-n junction;
   illuminating the illumination area of the surface of the p-n junction with light of an additional intensity, wherein the light of the additional intensity is sufficient to establish a steady-state condition in a junction photovoltage of the p-n junction;
   measuring an additional photovoltage from the portion of the p-n junction within the illumination area illuminated by the light of the additional intensity with the first transparent electrode;
   monitoring a one dimensional character of at least one of the first junction photovoltage or the additional junction voltage by measuring a junction photovoltage from a portion of the p-n junction within the illumination area with a second transparent electrode positioned within the illumination area and proximate to the surface of the p-n junction, the second transparent electrode having a second area external to the first area of the first transparent electrode;
   illuminating the illumination area of the surface of the p-n junction with light of the first intensity at a modulation frequency sufficient to achieve non-steady-state conditions in the junction photovoltage of the p-n junction;

measuring a high frequency junction photovoltage from the portion of the p-n junction within the illumination area with the first transparent electrode;

acquiring a capacitance of the p-n junction; and determining a photocurrent density of the p-n junction with at least one of the high frequency junction voltage, the capacitance of the p-n junction and the modulation frequency.

27. The method of claim 26, further comprising:

determining at least one of a forward voltage of the p-n junction, a saturation current density of the p-n junction or an ideality factor of the p-n junction with at least one of the measured first photovoltage, the measured additional photovoltage or the determined photocurrent density of the p-n junction.

28. The method of claim 26, further comprising:

generating one or more I-V curves of the p-n junction by acquiring a junction photovoltage and a corresponding photocurrent at each of a plurality of illumination intensities.

29. The method of claim 26, wherein at least one of the light of the first intensity or the light of the additional intensity comprises:

intensity modulated light having a modulation frequency low enough to establish a steady-state condition in the junction photovoltage of the p-n junction.

30. The method of claim 26, wherein at least one of the light of the first intensity or the light of the additional intensity comprises:

pulsed light having an intensity profile sufficient to establish a steady-state condition in the junction photovoltage of the p-n junction.

31. The method of claim 26, wherein the second transparent electrode is concentric to the first transparent electrode.

32. The method of claim 26, wherein the first surface of the p-n junction comprises:

a front surface of the p-n junction.

33. The method of claim 26, wherein the p-n junction comprises:

at least one of a homojunction based p-n junction and a heterojunction based p-n junction.

34. The method of claim 26, wherein the monitoring one dimensional character of at least one of the first junction photovoltage or the additional junction photovoltage voltage by measuring a junction photovoltage from a portion of the p-n junction within the illumination area with a second transparent electrode positioned within the illumination area and proximate to the surface of the p-n junction comprises:

measuring one dimensional character of the first junction photovoltage by measuring a junction photovoltage from a portion of the p-n junction within the illumination area illuminated with light of the first intensity with the second transparent electrode; and comparing the junction photovoltage measured from a portion of the p-n junction within the illumination area illuminated with light of the first intensity measured with the second transparent electrode to the first junction photovoltage measured from a portion of the p-n junction within the illumination area illuminated by the light of the first intensity with a first transparent electrode.

35. The method of claim 26, wherein the monitoring one dimensional character of at least one of the first junction photovoltage or the additional junction photovoltage by measuring a junction photovoltage from a portion of the p-n junction within the illumination area with a second transparent electrode positioned within the illumination area and proximate to the surface of the p-n junction comprises:

measuring one dimensional character of the additional junction photovoltage by measuring a junction photovoltage from a portion of the p-n junction within the illumination area illuminated with light of the additional intensity with the second transparent electrode; and comparing the junction photovoltage measured from a portion of the p-n junction within the illumination area illuminated with light of the additional intensity measured with the second transparent electrode to the additional junction photovoltage measured from a portion of the p-n junction within the illumination area illuminated by the light of the additional intensity with a first transparent electrode.

36. A method for contactless measurement of one or more characteristics of a p-n junction comprising:

illuminating an area of a surface of a p-n junction with light of a first intensity, wherein the light of the first intensity is sufficient to establish a steady-state condition in a junction photovoltage of the p-n junction;

measuring a first junction photovoltage from a portion of the p-n junction within the illumination area by determining a difference between a first surface potential measured during a dark illumination condition and an additional surface potential measured during illumination of the light of the first intensity in a steady-state condition with a first vibrating transparent electrode;

illuminating the area of the surface of the p-n junction with light of an additional intensity, wherein the light of the additional intensity is sufficient to establish a steady-state condition in a junction photovoltage of the p-n junction;

measuring an additional photovoltage from the portion of the p-n junction within the illumination area by determining a difference between the first surface potential measured during the dark illumination condition and an additional surface potential measured during illumination of the light of the additional intensity in a steady-state condition with the first vibrating transparent electrode; and determining a photocurrent density of the p-n junction at the first intensity.

37. The method of claim 36, further comprising:

determining at least one of a forward voltage of the p-n junction, a saturation current density of the p-n junction or an ideality factor with at least one of the measured first photovoltage, the measured additional photovoltage or the determined photocurrent density of the p-n junction.

38. The method of claim 36, further comprising:

generating one or more I-V curves of the p-n junction by acquiring a junction photovoltage and a corresponding photocurrent at each of a plurality of illumination intensities.

39. The method of claim 36, further comprising:

monitoring one-dimensional character of at least one of the first junction photovoltage or the additional junction voltage by measuring a junction photovoltage from a portion of the p-n junction within the illumination area with a second vibrating transparent electrode positioned within the illumination area and proximate to the surface of the p-n junction, the second vibrating transparent electrode having a second area external to the first area of the first transparent electrode.

40. The method of claim 39, wherein the monitoring one-dimensional character of at least one of the first junction photovoltage or the additional junction voltage by measuring a junction photovoltage from a portion of the p-n junction within the illumination area with a second vibrating transparent electrode positioned within the illumination area and proximate to the surface of the p-n junction comprises:
  measuring one-dimensional character of the first junction photovoltage by measuring a junction photovoltage from a portion of the p-n junction within the illumination area illuminated with light of the first intensity with the second vibrating transparent electrode; and
  comparing the junction photovoltage measured from a portion of the p-n junction within the illumination area illuminated with light of the first intensity with the second vibrating transparent electrode to the first junction photovoltage measured from a portion of the p-n junction within the illumination area illuminated by the light of the first intensity with the first vibrating transparent electrode.

41. The method of claim 39, wherein the monitoring one-dimensional character of at least one of the first junction photovoltage or the additional junction voltage by measuring a junction photovoltage from a portion of the p-n junction within the illumination area with a second vibrating transparent electrode positioned within the illumination area and proximate to the surface of the p-n junction comprises:
  measuring one-dimensional character of the additional junction photovoltage by measuring a junction photovoltage from a portion of the p-n junction within the illumination area illuminated with light of the additional intensity with the second vibrating transparent electrode; and
  comparing the junction photovoltage measured from a portion of the p-n junction within the illumination area illuminated with light of the additional intensity with the second vibrating transparent electrode to the additional junction photovoltage measured from a portion of the p-n junction within the illumination area illuminated by the light of the additional intensity with a first vibrating transparent electrode.

42. The method of claim 36, wherein at least one of the light of the first intensity or the light of the additional intensity comprises:
  intensity modulated light having a modulation frequency low enough to establish a steady-state condition in the junction photovoltage of the p-n junction.

43. The method of claim 36, wherein at least one of the light of the first intensity or the light of the additional intensity comprises:
  pulsed light having an intensity profile sufficient to establish a steady-state condition in the junction photovoltage of the p-n junction.

44. The method of claim 36, wherein the p-n junction comprises:
  at least one of a homojunction based p-n junction and a heterojunction based p-n junction.

45. The method of claim 36, wherein the determining a photocurrent density of the p-n junction at the first intensity comprises:
  determining a photocurrent density of the p-n junction at the first intensity by comparing an initial photocurrent density acquired with the first vibrating transparent electrode to a calibration photocurrent density acquired via one or more contact electrodes from a calibration p-n junction illuminated with light substantially similar to the light of the first intensity.

46. The method of claim 36, wherein the determining a photocurrent density of the p-n junction at the first intensity comprises:
  illuminating the area of the surface of the p-n junction with light of the first intensity at a modulation frequency sufficient to achieve non-steady-state conditions in the junction photovoltage of the p-n junction;
  measuring a high frequency junction photovoltage from the portion of the p-n junction within the illumination area with the first vibrating transparent electrode;
  acquiring a capacitance of the p-n junction; and
  determining a photocurrent density of the p-n junction at the modulation frequency sufficient to achieve non-steady-state conditions in the junction photovoltage of the p-n junction with the high frequency junction voltage, the capacitance of the p-n junction and the modulation frequency.

* * * * *